US012751060B2

(12) United States Patent
Moutanabbir et al.

(10) Patent No.: US 12,751,060 B2
(45) Date of Patent: Sep. 29, 2026

(54) QUANTUM HETEROSTRUCTURES, RELATED DEVICES AND METHODS FOR MANUFACTURING THE SAME

(71) Applicant: ECOLE POLYTECHNIQUE DE MONTREAL, Montreal (CA)

(72) Inventors: Oussama Moutanabbir, Montréal (CA); Simone Assali, Grenoble (FR); Anis Attiaoui, Menlo Park, CA (US); Patrick Del Vecchio, The Hague (NL)

(73) Assignee: ECOLE POLYTECHNIQUE DE MONTREAL, Montreal (CA)

( * ) Notice: Subject to any disclaimer, the term of this patent is extended or adjusted under 35 U.S.C. 154(b) by 0 days.

(21) Appl. No.: 17/615,649

(22) PCT Filed: Jun. 3, 2020

(86) PCT No.: PCT/CA2020/050764

§ 371 (c)(1),
(2) Date: Dec. 1, 2021

(87) PCT Pub. No.: WO2020/243831

PCT Pub. Date: Dec. 10, 2020

(65) Prior Publication Data

US 2022/0310793 A1 Sep. 29, 2022

Related U.S. Application Data

(60) Provisional application No. 62/856,500, filed on Jun. 3, 2019.

(51) Int. Cl.
*H10D 62/81* (2025.01)
*H10D 48/00* (2025.01)
(Continued)

(52) U.S. Cl.
CPC ......... *H10D 62/814* (2025.01); *H10D 48/383* (2025.01); *H10D 62/824* (2025.01); *H10P 14/3211* (2026.01); *H10P 14/3221* (2026.01)

(58) Field of Classification Search
CPC ............... H01L 29/127; H01L 21/0245; H01L 21/02463; H01L 29/205; H01L 29/66977;
(Continued)

(56) References Cited

U.S. PATENT DOCUMENTS 5,548,128 A * 8/1996 Soref ...................... H01L 33/06 257/190
6,288,410 B1 * 9/2001 Miyazawa ............. B82Y 20/00 257/97
(Continued)

FOREIGN PATENT DOCUMENTS

JP 2008288395 A * 11/2008 ....... H01L 21/02381
WO WO-2006034025 A1 * 3/2006 ............. B82Y 20/00
(Continued)

OTHER PUBLICATIONS

International Search Report and Written Opinion dated Sep. 2, 2020 issued in corresponding International Application No. PCT/CA2020/050764.

(Continued)

*Primary Examiner* — Mohammed Shamsuzzaman
(74) *Attorney, Agent, or Firm* — NORTON ROSE FULBRIGHT CANADA LLP

(57) ABSTRACT

There is provided a quantum heterostructure and related devices, as well as methods for manufacturing the same. The quantum heterostructure includes a stack of coextending GeSn buffer layers and each GeSn buffer layer has a different Sn content one from another. The quantum heterostructure also includes a quantum well extending over the stack of coextending GeSn buffer layers, the quantum well
(Continued)

comprising a highly tensile-strained layer, the highly tensile-strained layer comprising at least one group IV element and having a strain greater than or equal to 1%. The quantum heterostructure is compatible with silicon-based processing, manufacturing, and technologies. The method includes changing a reactor temperature and varying a molar fraction of an Sn-based precursor to achieve a stack of coextending GeSn buffer layers, each having a different Sn composition, on a substrate provided inside the reactor chamber and forming the quantum well over the stack of coextending GeSn buffer layers.

19 Claims, 14 Drawing Sheets

(51) Int. Cl.
*H10D 62/824* (2025.01)
*H10P 14/20* (2026.01)

(58) Field of Classification Search
CPC ......... H01L 21/02381; H01L 21/02452; H01L 21/02502; H01L 21/02505; H01L 21/02532; H01L 21/02535; H01L 21/0262; H01L 29/122; H01L 29/161; H01L 29/66439; H01L 33/0054; H01L 33/12; H01L 33/34; H01L 29/15; H01L 29/16
See application file for complete search history.

(56) References Cited

U.S. PATENT DOCUMENTS 6,897,471 B1 * 5/2005 Soref .................... H01L 31/105 257/14
6,944,386 B2 9/2005 Hamilton
7,582,891 B2 * 9/2009 Kouvetakis ......... H01L 21/0262 257/14
8,029,905 B2 * 10/2011 Kouvetakis ....... H01L 21/02535 428/450
8,647,439 B2 * 2/2014 Sanchez ............ H01L 21/02576 438/758
9,330,907 B2 5/2016 Chen et al.
9,666,702 B2 5/2017 Kim
9,905,420 B2 2/2018 Margetis et al.
9,997,659 B2 6/2018 King et al.
10,763,347 B2 * 9/2020 Amin ...................... H01L 29/12
11,158,731 B2 * 10/2021 Pillarisetty ............. H01L 29/82
2004/0075098 A1 4/2004 Hamilton
2007/0020891 A1 * 1/2007 Kouvetakis ............. C30B 25/02 438/479
2008/0187768 A1 * 8/2008 Kouvetakis ........... H01L 31/101 428/450
2008/0277647 A1 * 11/2008 Kouvetakis ....... H01L 21/02452 257/E31.011
2011/0198729 A1 * 8/2011 Kouvetakis ......... H01L 21/0245 257/E29.1
2011/0254052 A1 * 10/2011 Kouvetakis ....... H01L 21/02452 257/190
2011/0254653 A1 * 10/2011 Radamson ............ B82Y 20/00 438/54
2014/0054547 A1 * 2/2014 Eneman .............. H01L 29/7781 257/24
2014/0076387 A1 * 3/2014 King ................... H01L 31/0745 136/262
2015/0014632 A1 * 1/2015 Kim .................. H01L 29/66318 438/312
2015/0102465 A1 * 4/2015 Chen ................. H01L 21/02532 438/492
2017/0154770 A1 * 6/2017 Margetis ........... H01L 21/02535
2017/0263736 A1 9/2017 Kim
2018/0323340 A1 * 11/2018 El-Ghoroury ........... H01L 33/08
2020/0350423 A1 * 11/2020 Pillarisetty ............ H01L 29/127

FOREIGN PATENT DOCUMENTS

WO WO-2006099171 A2 * 9/2006 ......... C23C 16/0272
WO WO-2020120279 A1 * 6/2020 ....... H01L 21/02381

OTHER PUBLICATIONS

Dobbie et al. "Ultra-high hole mobility exceeding one million in a strained germanium quantum well", American Institute of Physics Applied Physics Letters 101, 172108 (2012), p. 172108-1-172108-4.
Morrison et al. "Electronic transport anisotropy of 2D carriers in biaxial compressive strained germanium", American Institute of Physics Applied Physics Letters 111, 192103 (2017), p. 1-5.
Sammak et al. "Shallow and Undoped Germanium Quantum Wells: A Playground for Spin and Hybrid Quantum Technology", Advanced Science News, Advanced Functional Materials Journal (2019), p. 1-8.
Hikavyy et al. "Use of high order precursors for manufacturing gate all around devices", Materials Science in Semiconductor Processing 70 (2017) p. 24-29.
Witters et al. "Strained Germanium Gate-All-Around PMOS device demonstration using Selective Wire Release Etch prior to Replacement Metal Gate Deposition", 2017 Symposium on VLSI Technology Digest of Technical Papers, p. T194-T195.
Moutanabbir et al. "Transport of Deposited Atoms throughout Strain-Mediated Self-Assembly", The American Physical Society Physical Review Letters 105, 026101 (2010), p. 1-4.
Guilloy et al. "Germanium under High Tensile Stress: Nonlinear Dependence of Direct Band Gap vs Strain", ACS Photonics 2016, vol. 3, p. 1907-1911.
Sweeney et al. "The impact of strained layers on current and emerging semiconductor laser systems", Journal of Applied Physics, 125, 082538 (2019), p. 1-11.
Soref et al. "Direct-Gap Ge/GeSn/Si and GeSn/Ge/Si Heterostructures", Superlattices and Microstructures, vol. 14, No. 2/3, 1993, p. 189-193.
Wirths et al. "Lasing in direct-bandgap GeSn alloy grown on Si", Nature Photonics vol. 9 (Feb. 2015), p. 88-92.
Aubin et al. "Growth and structural properties of stepgraded, high Sn content GeSn layers on Ge", Semiconductor Science and Technology 32 (2017) 094006 (8pp).
Margetis et al. "Strain engineering in epitaxial Ge1—xSnx: a path towards low-defect and high Sn-content layers", Semiconductor Science and Technology 32 (2017) 124006 (6pp).
Assali et al. "Atomically uniform Sn-rich GeSn semiconductors with 3.0-3.5 um room-temperature optical emission", Applied Physics Letters 112, 251903 (2018) p. 1-5.
Assali et al. "Enhanced Sn incorporation in GeSn epitaxial semiconductors via strain relaxation", Journal of Applied Physics 125, 025304 (2019); doi: 10.1063/1.5050273, p. 1-12.
Takeuchi et al. "Tensile strained Ge layers on strain-relaxed Ge1—xSnx/virtual Ge substrates" Thin Solid Films 517 (2008) 159-162.
Wirths et al. "Band engineering and growth of tensile strained Ge/(Si)GeSn heterostructures for tunnel field effect transistors", Applied Physics Letters 102, 192103 (2013), p. 1-4.
Volodin et al. "Splitting of Frequencies of Optical Phonons in Tensile-Strained Germanium Layers", JETP Letters, 2017, vol. 105, No. 5, pp. 327-331.
Bai et al. "Growth of highly tensile-strained Ge on relaxed InxGa1—xAs by metalorganic chemical vapor deposition", Journal of Applied Physics 104, 084518 2008, p. 1-9.
Clavel et al. "Strain-Engineered Biaxial Tensile Epitaxial Germanium for High-Performance Ge/InGaAs Tunnel Field-Effect Transistors", Journal of the Electron Devices Society, vol. 3, No. 3, May 2015, p. 184-193.

(56) References Cited

OTHER PUBLICATIONS

Clavel et al. "Heterogeneously-Grown Tunable Tensile Strained Germanium on Silicon for Photonic Devices", American Chemical Society Applied Material Interfaces 2015, 7, p. 26470-26481.
Saladukha et al. "Direct and indirect band gaps in Ge under biaxial tensile strain investigated by photoluminescence and photoreflectance studies", Physical Review B 97, 195304 (2018), p. 1-12.
Stange et al. "Study of GeSn based heterostructures: towards optimized group IV MQW LEDs", Optics Express, vol. 24, No. 2 (Jan. 25, 2016), p. 1358-1367.
Xu et al. "High-speed photo detection at two-micronwavelength: technology enablement by GeSn/Ge multiple-quantum-well photodiodeon 300 mm Si substrate", Optics Express vol. 27, No. 4 (Feb. 18, 2019), p. 5798-5813.
Tiedemann et al. "Band engineering and growth of tensile strained Ge/(Si)GeSn heterostructures for tunnel field effect transistors", American Institute of Physics Applied Physics Letters, May 2013. Retrieved Aug. 6, 2020 from: URL: https://www.researchgate.net/publication/236734560_Band_engineering_and_growth_of_tensile_strained_GeSiGcSn_heterostructures_for_tunnel_field_effect_transistors. p. 192103-2, right column, second paragraph.
Extended European Search Report dated Jun. 21, 2023 issued in European Application No. 20817986.

* cited by examiner 12.5 nm 10.5 nm 7.5 nm 3.5-5.5 nm

FIG. 3b
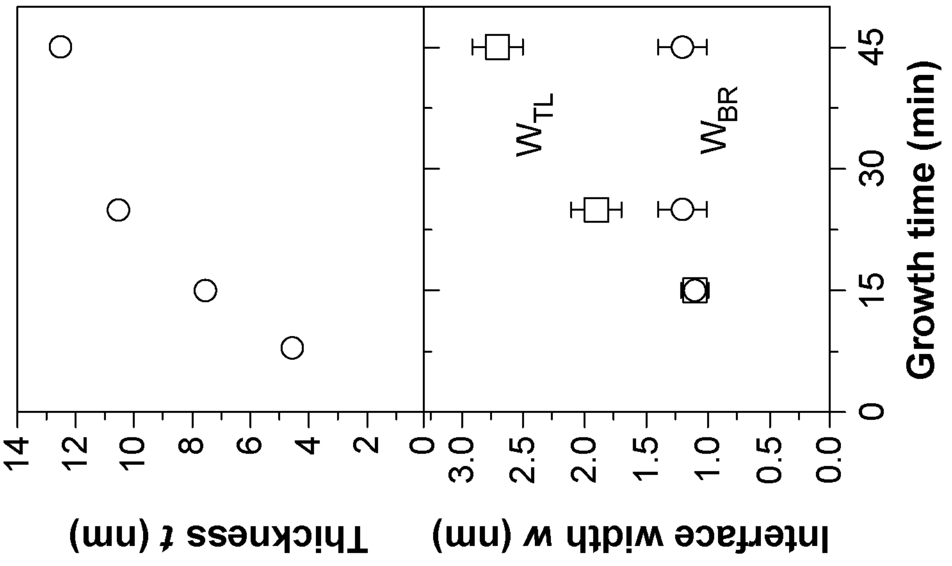
FIG. 3c
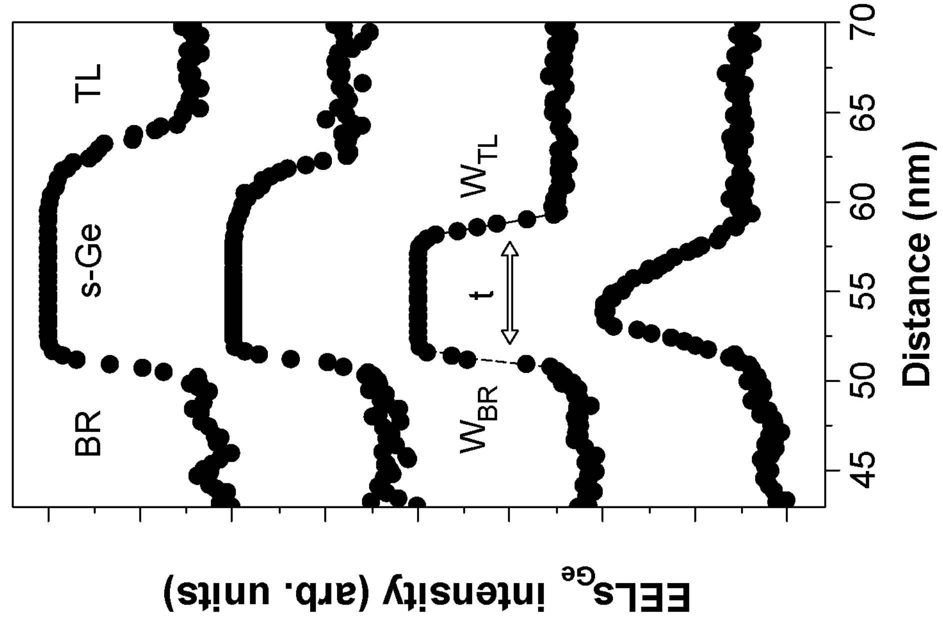
FIG. 3a 7.5 nm s-Ge QW

FIG. 6b
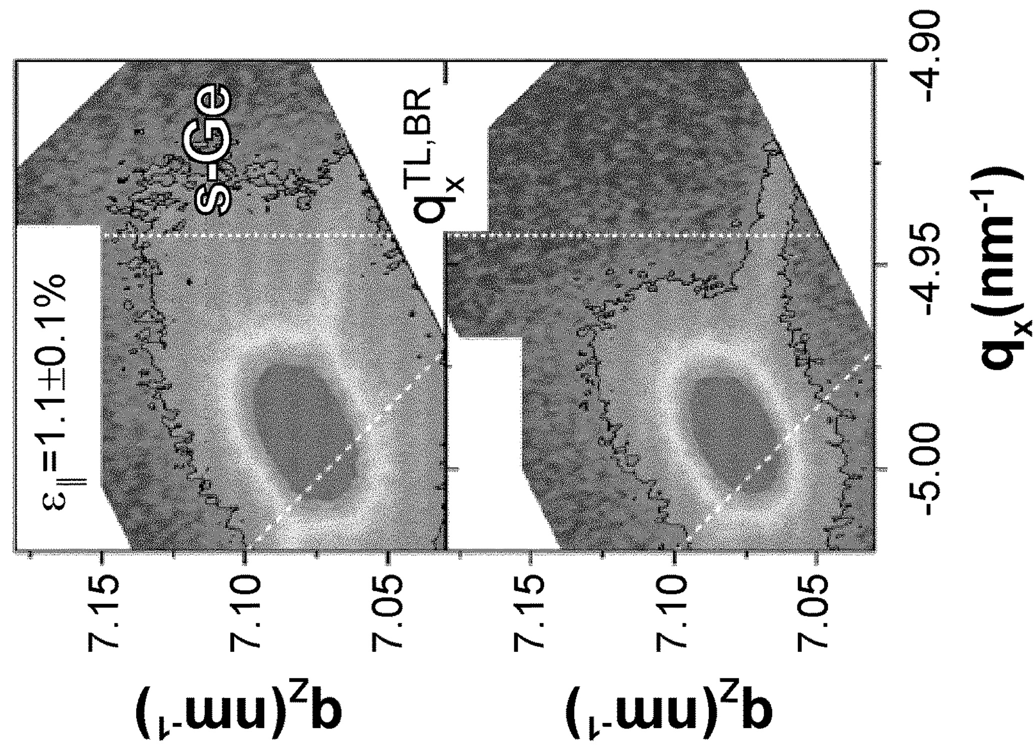
FIG. 6c
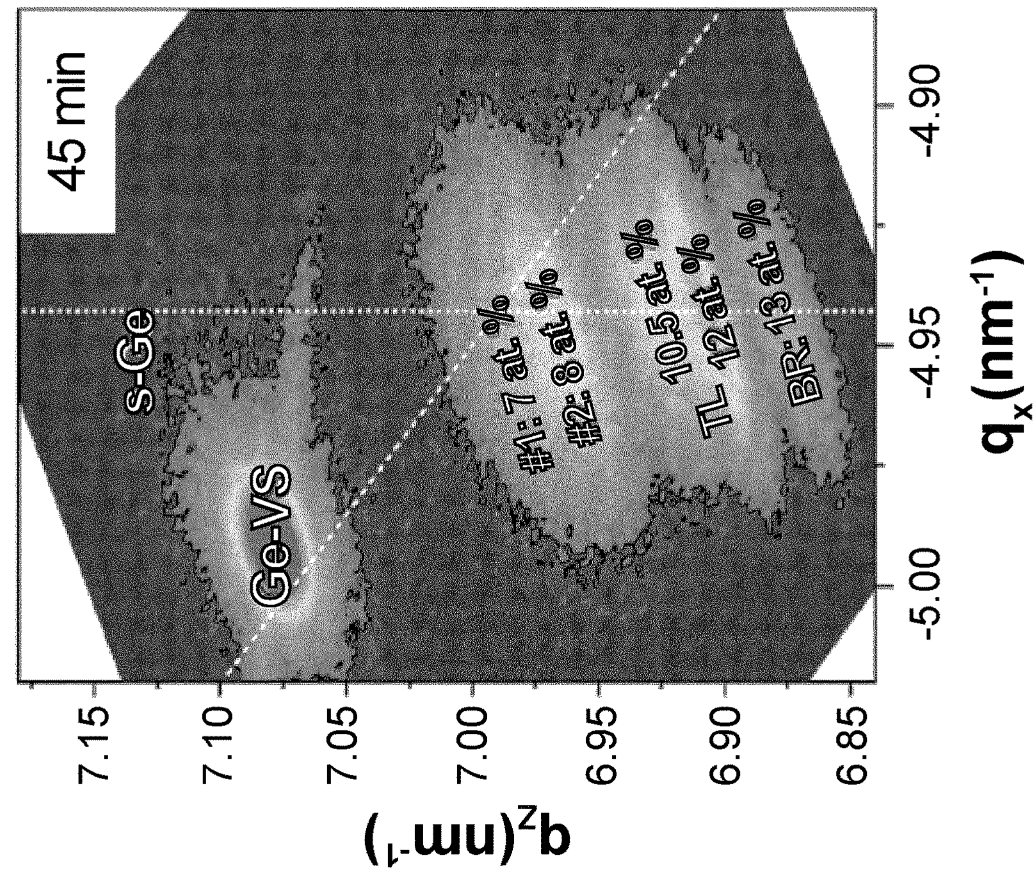
FIG. 6a 0.35 nm step
(replace with 0.2 nm)

QUANTUM HETEROSTRUCTURES, RELATED DEVICES AND METHODS FOR MANUFACTURING THE SAME

TECHNICAL FIELD

The technical field generally relates to low-dimensional semiconductor systems, structures, devices, and methods for preparing the same, and more particularly concerns a quantum well heterostructure having one highly tensile-strained layer, associated devices and methods for manufacturing the same.

BACKGROUND

Silicon and germanium are well-known semiconductors and are widely used in electronic, optoelectronic, photonic, sensing, energy, spintronic, and quantum devices and similar devices. Indeed, numerous technologies exploit some properties of these materials. Some challenges are associated with these materials, such as for example and without being limitative, achieving novel or enhanced performance devices while lowering the costs of manufacturing. Major efforts have been expended to improve and control the basic properties of silicon and germanium and their related group IV alloys, as evidenced by the organization of several conferences across the world and the hundreds of thousands of papers and patents being published every year reporting on methods to improve the capabilities of silicon and germanium to develop enhanced or novel functionalities.

For decades silicon-based and germanium-based low-dimensional systems have been used as building blocks for a variety of electronic, optoelectronic, photonic, energy, sensing, spintronic, and quantum information devices. These low-dimensional systems generally include two different heterostructures. The first heterostructure includes a very thin layer (i.e., a quantum well) of silicon sandwiched between two layers made of a silicon-germanium alloy. This first heterostructure is typically known as a "tensile-strained silicon quantum well". The second heterostructure includes a very thin layer (i.e., a quantum well) of germanium sandwiched between two layers made of a silicon-germanium alloy. This second heterostructure is typically known as a "compressively-strained germanium quantum well". Using this configuration, the first heterostructure creates a two-dimensional electron gas (2DEG), whereas the second heterostructure creates a two-dimensional hole gas (2DHG), in which the heavy-hole occupies the top of the valence band. In principle, creating other low-dimensional systems, e.g. tensile-strained germanium quantum well, will enable an entirely new class of devices.

In fact, challenges still exist in the field of low-dimensional systems, and more particularly in the field of quantum well heterostructures and their implementation in different devices, as well as methods for manufacturing the same.

SUMMARY

In accordance with one aspect, there is provided a quantum heterostructure, comprising a stack of coextending GeSn buffer layers, each GeSn buffer layer having a different Sn content one from another; and a quantum well extending over the stack of coextending GeSn buffer layers, the quantum well comprising a highly tensile-strained layer, the highly tensile-strained layer comprising at least one group IV element and having a strain greater than or equal to 1%. In some embodiments, the GeSn layers are optically active.

In some embodiments, the at least one group IV element is germanium.

In some embodiments, the highly tensile-strained layer is sandwiched between a bottom barrier layer and a top barrier layer.

In some embodiments, the stack of coextending GeSn buffer layers comprises between one and six layers.

In some embodiments, the stack of coextending GeSn buffer layers comprises five layers.

In some embodiments, the stack of coextending GeSn buffer layers and the quantum well comprise at least one p-type doped layer.

In some embodiments, the stack of coextending GeSn buffer layers and the quantum well comprise at least one n-type doped layer.

In some embodiments, the stack of coextending GeSn buffer layers and the quantum well comprises at least one p-n junction.

In some embodiments, the stack of coextending GeSn buffer layers and the quantum well comprises at least one p-i-n junction.

In some embodiments, the strain ranges from about 1% to about 2%.

In some embodiments, the strain ranges from about 1.55% to about 1.75%.

In some embodiments, the strain is equal or higher than 2%.

In some embodiments, the quantum heterostructure further comprises a substrate.

In some embodiments, the substrate is a Si-on-insulator (SOI) wafer.

In some embodiments, the substrate is bulk Ge.

In some embodiments, the substrate is a Ge-on-insulator (GOI) wafer.

In some embodiments, the substrate is a compound semiconductor wafer.

In some embodiments, the substrate is a compound semiconductor layer grown on Si.

In some embodiments, the substrate is a compound semiconductor layer grown on Ge.

In some embodiments, the substrate is a compound semiconductor layer grown on SOI.

In some embodiments, the substrate is a compound semiconductor layer grown on GOI.

In some embodiments, the substrate is selected from GaP, GaAs, GaSb, InP, InAs InSb, ZnS, ZnSe, CdS, CdSe, ZnTe, CdTe, WSe and their alloys.

In some embodiments, the composition of the buffer layers varies substantially continuously across the stack of coextending GeSn buffer layers.

In some embodiments, said at least one group IV element is a stable isotope.

In some embodiments, the highly tensile-strained layer comprises at least one Ge stable isotope selected from $^{70}Ge$, $^{72}Ge$, $^{73}Ge$, $^{74}Ge$, and $^{76}Ge$.

In some embodiments, the stack of coextending GeSn buffer layers and the highly tensile-strained layer are released from the substrate, thereby forming a freestanding quantum heterostructure.

In some embodiments, the freestanding quantum heterostructure is transferrable onto a different substrate.

In some embodiments, the different substrate is a semiconductor, a dielectric, a metal, or a polymer.

In accordance with another aspect, there is provided a device, comprising a substrate; a quantum heterostructure coating the substrate, the quantum heterostructure comprising: a stack of coextending GeSn buffer layers, each GeSn buffer layer having a different Sn content one from another; and a quantum well extending over the stack of coextending GeSn buffer layers, the quantum well comprising a highly tensile-strained layer, the highly tensile-strained layer comprising at least one group IV element and having a strain greater than or equal to 1%; and two or more electrodes operatively connected to the quantum heterostructure.

In some embodiments, the at least one group IV element material is Ge.

In some embodiments, the highly tensile-strained layer is sandwiched between a bottom barrier layer and a top barrier layer.

In some embodiments, the bottom barrier layer and the top barrier layer are each optically active.

In some embodiments, the stack of coextending GeSn buffer layers comprises between one and six layers.

In some embodiments, the stack of coextending GeSn buffer layers comprises five layers.

In some embodiments, the strain ranges from about 1% to about 2%.

In some embodiments, the strain ranges from about 1.55% to about 1.75%.

In some embodiments, the strain is equal or higher than 2%.

In some embodiments, the substrate is made from Ge.

In some embodiments, the substrate is bulk Ge.

In some embodiments, the substrate is Si-on-insulator (SOI wafer).

In some embodiments, the substrate is a Ge-on-insulator (GOI) wafer.

In some embodiments, the substrate is a compound semiconductor wafer.

In some embodiments, the substrate is a compound semiconductor layer grown on Si.

In some embodiments, the substrate is a compound semiconductor layer grown on Ge.

In some embodiments, the substrate is a compound semiconductor layer grown on SOI.

In some embodiments, the substrate is a compound semiconductor layer grown on GOI.

In some embodiments, the substrate is selected from GaP, GaAs, GaSb, InP, InAs InSb, ZnS, ZnSe, CdS, CdSe, ZnTe, CdTe, WSe and their alloys.

In some embodiments, the substrate comprises a virtual substrate layer and an original substrate layer.

In some embodiments, the virtual substrate layer is made from Ge and the original substrate layer is made from Si.

In some embodiments, the stack of coextending GeSn buffer layers and the quantum well comprises at least one p-type doped layer.

In some embodiments, the stack of coextending GeSn buffer layers and the quantum well comprises at least one n-type doped layer.

In some embodiments, the stack of coextending GeSn buffer layers and the quantum well comprises at least one p-n junction.

In some embodiments, the stack of coextending GeSn buffer layers and the quantum well comprises at least one p-i-n junction.

In some embodiments, the strain ranges from about 1% to about 2%.

In some embodiments, the strain ranges from about 1.55% to about 1.75%.

In some embodiments, the strain is equal or higher than 2%.

In some embodiments, the composition of the GeSn coextending buffer layers varies substantially continuously across the stack.

In some embodiments, said at least one group IV element is a stable isotope.

In some embodiments, the highly tensile-strained layer comprises at least one Ge stable isotope selected from $^{70}$Ge, $^{72}$Ge, $^{73}$Ge, $^{74}$Ge and $^{76}$Ge.

In some embodiments, the stack of coextending GeSn buffer layers and the highly tensile-strained layer are released from the substrate, thereby forming a freestanding quantum heterostructure.

In some embodiments, the freestanding quantum heterostructure is transferrable onto a different substrate.

In some embodiments, the different substrate is a semiconductor, a dielectric, a metal, or a polymer.

In accordance with another aspect, there is provided a quantum heterostructure, comprising: one or more buffer layers, each buffer layer being made from an alloy and having a different composition one from another, the alloy comprising at least two group-IV elements; a bottom barrier layer extending over the one or more buffer layers; a tensile-strained semiconductor layer extending over the bottom barrier layer, the tensile-strained semiconductor layer being made from one group-IV element and having a strain greater than or equal to 1%; and a top barrier layer extending over the tensile-strained semiconductor layer.

In some embodiments, the alloy comprises at least two of: silicon, germanium, tin, and carbon.

In some embodiments, the tensile-strained semiconductor layer is made from germanium, silicon, carbon, tin or a combination thereof.

In some embodiments, the stack of coextending GeSn buffer layers and the quantum well comprises at least one p-type doped layer.

In some embodiments, the stack of coextending GeSn buffer layers and the quantum well comprises at least one n-type doped layer.

In some embodiments, the stack of coextending GeSn buffer layers and the quantum well comprises at least one p-n junction.

In some embodiments, the stack of coextending GeSn buffer layers and the quantum well comprises at least one p-i-n junction.

In some embodiments, the quantum heterostructure comprises at least one additional highly tensile-strained quantum layer.

In some embodiments, the quantum heterostructure comprises a substrate.

In some embodiments, the substrate is an Si-on-insulator (SOI) wafer.

In some embodiments, the substrate is bulk Ge.

In some embodiments, the substrate is a Ge-on-insulator (GOI) wafer.

In some embodiments, the substrate is a compound semiconductor wafer.

In some embodiments, the substrate is a compound semiconductor layer grown on Si.

In some embodiments, the substrate is a compound semiconductor layer grown on Ge.

In some embodiments, the substrate is a compound semiconductor layer grown on SOI.

In some embodiments, the substrate is a compound semiconductor layer grown on GOI.

In some embodiments, the substrate is selected from GaP, GaAs, GaSb, InP, InAs InSb, ZnS, ZnSe, CdS, CdSe, ZnTe, CdTe, WSe and their alloys.

In some embodiments, the composition of the buffer layers varies substantially continuously across the stack.

In some embodiments, said at least one group IV element is a stable isotope.

In some embodiments, the highly tensile-strained layer comprises at least one Ge stable isotope selected from $^{70}$Ge, $^{72}$Ge, $^{73}$Ge, $^{74}$Ge, and $^{76}$Ge.

In some embodiments, the stack of coextending GeSn buffer layers and the highly tensile-strained layer are released from the substrate, thereby forming a freestanding quantum heterostructure.

In some embodiments, the freestanding quantum heterostructure is transferrable onto a different substrate.

In some embodiments, the different substrate is a semiconductor, a dielectric, a metal, or a polymer.

In accordance with another aspect, there is provided a method for preparing a quantum heterostructure, comprising: conditioning a reactor chamber to reach initial growth conditions; supplying a Ge-based precursor and a Sn-based precursor in the reactor chamber; forming a stack of coextending GeSn buffer layers on a substrate provided inside the reactor chamber, comprising: forming a first GeSn buffer layer by exposing the substrate to the initial growth conditions; conditioning the reactor chamber to reach subsequent growth conditions, comprising: changing a reactor temperature; and varying a molar fraction of at least one of the Sn-based precursor and the Ge-based precursor; forming one or more subsequent GeSn buffer layers on the first buffer layer by exposing the first GeSn buffer layer to the subsequent growth conditions, each GeSn buffer layer having a different Sn content one from another; and forming a quantum well over the stack of coextending GeSn buffer layers, the quantum well comprising a highly tensile-strained layer, the highly tensile-strained layer comprising at least one group IV element and having a strain greater than or equal to 1%.

In some embodiments, said growing of the stack of coextending GeSn buffer layers and said growing of the highly tensile-strained quantum well are each carried out with an epitaxial growth method.

In some embodiments, said epitaxial growth method comprises a low-pressure chemical vapor deposition.

In some embodiments, the method comprises preparing the substrate, said preparing comprising growing a virtual substrate layer on an original substrate layer.

In some embodiments, said step of growing the virtual substrate layer is carried out at a temperature ranging from about 460° C. to about 600° C. and further comprises thermally treating the virtual substrate layer at a thermal treatment temperature greater than or equal to 800° C.

In some embodiments, each buffer layer is grown at a substantially constant reactor pressure, a substantially constant H2 flow and a substantially constant molar fraction of the Ge-based precursor.

In some embodiments, the Ge-based precursor is GeH4 and the Sn-based precursor is SnCl4.

In some embodiments, said changing the reactor temperature comprises reducing the temperature and said varying the molar fraction of said at least one of the Sn-based precursor and the Ge-based precursor comprises reducing the molar fraction of the Sn-based precursor.

In some embodiments, said forming of the stack of coextending GeSn buffer layers includes supplying at least two of silicon, germanium, tin and carbon precursors.

In some embodiments, the highly tensile-strained layer is made from germanium, silicon, carbon, tin or a combination thereof.

In some embodiments, the method further comprises incorporating a p-type dopant.

In some embodiments, the p-type dopant is selected from boron, aluminum and gallium.

In some embodiments, the method further comprises incorporating a n-type dopant.

In some embodiments, the n-type dopant is selected from phosphorus, arsenic and antimony.

In some embodiments, the method comprises alternating an incorporation of an n-type dopant and a p-type dopant.

In accordance with another aspect, there is provided a method for manufacturing a quantum heterostructure-based device, comprising preparing a quantum heterostructure as described above; and operatively connecting the quantum heterostructure to two or more electrodes.

In accordance with another aspect, there is provided a quantum heterostructure prepared according to the method as described above.

Other features will be better understood upon reading of embodiments thereof with reference to the appended drawings.

BRIEF DESCRIPTION OF THE DRAWINGS

FIG. 3*a* includes a plot of the EELS profile for the Ge atoms across the QW for the four different samples. Solid lines are the fits using equation 1 (see below);

FIG. 3*b* is a plot of the Ge QW thickness t and FIG. 3*c* is a plot of the interface width w as a function of the growth time.

FIG. 6*a* illustrates RSM around the asymmetrical (224) reflection for the 11.0 nm thick QW; and FIGS. 6*b*-*c* are HRRSM maps acquired in the Ge-VS peak region showing the presence of the s-Ge peak when compared to the reference stacking without s-Ge growth, respectively.

DETAILED DESCRIPTION

Figure 1A:
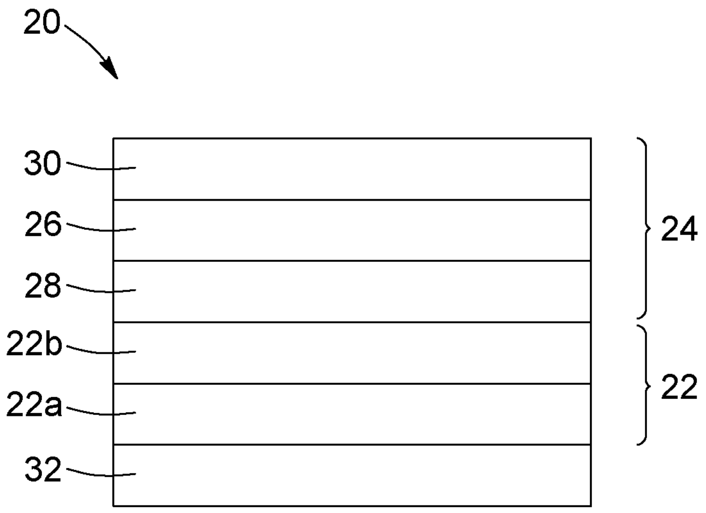
FIGS. 1*a*-*d* are visual representation of a quantum well heterostructure in accordance with one embodiment, a quantum well heterostructure in accordance with another embodiment, a device in accordance with one embodiment and a substrate coated with buffer layers in accordance with one embodiment.

In the following description, similar features in the drawings have been given similar reference numerals. In order to not unduly encumber the figures, some elements may not be indicated on some figures if they were already mentioned in preceding figures. It should also be understood herein that the elements of the drawings are not necessarily drawn to scale and that the emphasis is instead being placed upon clearly illustrating the elements and structures of the present embodiments.

The expression "heterostructure" will be used throughout the description and refers to a structure including at least two layers with different composition and electronic properties.

In the following description, the expression "quantum well" or "QW" generally refers to a heterostructure in which at least one type of charged carriers (i.e., electrons and/or holes) are confined in one direction (typically out-of-plane) and free in the other two directions (typically the in-plane directions). Quantum confinement is a quantum property that emerges when a particle is localized in a volume that has at least one reduced lateral dimension, e.g., a few nanometers. In this situation, the energy of the particle becomes quantized in this direction.

The expression "device" refers to a component or an assembly associated with a functionality. For example, an "optoelectronic device" is a device that can accomplish a specific functionality involving the use or manipulation of both charge carriers and photons (e.g., lasers, light emitting diodes, photodetectors, solar cells, sensors and imagers, and others). Many other types of devices exist, such as, and without being limitative ultrafast transistors, quantum information devices, spintronics devices, energy conversion devices, sensors and imagers, and hybrid photonics-electronics devices.

The expression "highly tensile-strained" will be used when the lattice parameter in at least one crystallographic direction is much larger than the value at equilibrium. In this context, the lattice is said to be "stretched". As such, the expression "strain" will be used to reflect a relative change in lattice parameter with respect to its equilibrium value. It is to be noted that the expressions "lattice constant" and "lattice parameter", which will be used interchangeably, refer to the equilibrium interatomic distance along a specific crystallographic direction in a crystalline material.

The group-IV elements are the elements of column IV of the periodic table, e.g., C, Si, Ge, Sn and Pb and their stable isotopes.

The term "alloy" refers to a material or a composition including at least two different elements. For example, and without being limitative, an alloy could include two, three or four different elements.

The term "p-type doping" refers to the incorporation of an impurity in the growing layer to create an excess of positive charges known as holes.

The term "n-type doping" refers to the incorporation of an impurity in the growing layer to create an excess of negative charges known as electrons.

The term "intrinsic doping (i)" refers to the case where a semiconductor layer has no excess negative or positive charges.

The terms "p-n junction" or "n-p junction" refer to two successive layers, wherein one layer is p-type doped and the other one is n-type doped.

The terms "p-i-n junction" or "n-i-p junction" refer to three successive layers, wherein one layer is p-type doped, one is intrinsic, and one is n-type doped.

General Theoretical Overview

Lattice strain engineering and quantum confinement are two phenomena that have been used to tailor, i.e., alter and/modify, the physical properties of semiconductors, in order to facilitate or promote the implementations of the semiconductors in a broad variety of low-dimensional systems and devices, while enhancing the performance of the same [1]. For decades, these strategies have been extensively explored and exploited in, for instance, epitaxial compound III-V semiconductors by capitalizing on the ability to independently engineer the lattice parameter and bandgap structure, thus leading to a broad range of relaxed and strained (both compressive and tensile) QWs. Extending this paradigm to group IV semiconductors is attractive, especially given the broad technological potential of Si-compatible low-dimensional systems. Nevertheless, due to the lack of proper materials, these systems are yet to be fully developed on an all group IV platform. Indeed, for decades the focus has been on tensile-strained Si and compressively-strained Ge QWs, which are the only systems that can currently be routinely obtained using SiGe as growth template and barrier layers [2-4]. These low-dimensional systems have been the subject of extensive studies for Si-compatible high mobility transistors, quantum cascade lasers, and quantum computing. For instance, compressively-strained Ge have recently been attracting attention as building block for electronics and hole spin qubits. In a Ge/SiGe heterostructure, a type I band-alignment is obtained. In such a heterostructure, in-plane compressive strain up to −0.65% in the Ge layer has been achieved, which allowed to obtain heavy-hole (HH) mobilities up to $1.1\cdot10^6$ $cm^2V^{-1}s^{-1}$ along the <110> direction in 2D hole gas field effect transistors (FETs) [2,4]. Similarly, enhanced mobility in strained Ge/SiGe Gate-All-Around FETs led to improved performances [5,6].

Achieving tensile-strained Ge QW heterostructures has the potential to further improve these properties and potentially enable new ones thus creating innovative functionalities harnessing the new and improved physical properties associated with tensile strain and quantum confinement. For instance, in quantum computing, the sought-for advantages of Ge in qubits are, for example and without being limitative: (i) a high hole mobility, (ii) the holes have much stronger spin-orbit coupling, which can be exploited to achieve much faster spin manipulations (iii) the fourfold degeneracy of the valence band, which is not compatible with the two-level system at the core of quantum system, is eliminated by introducing strain quantum confinement in the QW, hence leading to a reduced hole effective mass and a large intrinsic splitting between the light-hole (LH) and HH bands, which can potentially enable high mobilities and tunnel rates in addition to the need for smaller quantum dot size and (iv) a reduced hyperfine interaction with surrounding nuclear spins for improved quantum coherence as Ge can be purified to remove nuclear spin-full $^{73}$Ge impurities

[7]. These advantages and potential applications can be further enhanced by introducing tensile strain in Ge QW. Indeed, unlike the compressive strain case [8,9], the top of the valence band is of LH type under tensile strain, thus corresponding to a much smaller effective mass and ½ spin. Moreover, if the strain is sufficiently high (e.g., ca. 2%), Ge becomes a direct bandgap material with enhanced optical properties. These properties make tensile strained Ge QWs attractive for high mobility transistors, hole spin qubits, sensors and imagers, optoelectronic devices, hybrid photonic-electronic quantum devices and other similar devices.

As mentioned above, the III-V systems benefit from a much broader flexibility in design and growth of strain-engineered QWs. The advent of Sn-containing group IV alloys (Si)GeSn holds the premise to enable similar flexibility in lattice and band offset control in Si- and Ge-based heterostructures.

An all-group-IV integrated semiconductor platform for tensile-strained Ge (not a QW) was proposed back in 1993, where a direct-band gap is obtained in Ge when grown on the lattice-mismatched $Ge_{0.87}Sn_{0.13}$ alloy [10]. The main challenge with this approach is to increase the incorporation of Sn in the Ge lattice above the ~1 at. % equilibrium composition. Major developments have recently been achieved in the GeSn epitaxy leading to high-quality GeSn alloys with composition above 12 at. % [11-15]. A biaxial tensile strain in an uncapped Ge layer up to ~1.5% was demonstrated by growing on a $Ge_{0.88}Sn_{0.12}$ layer [16-18]. It is to be noted that a few studies have employed InGaAs on GaAs substrates to achieve tensile strained Ge [19-22]. Notwithstanding these contributions, the need for III-V substrates comes with a few hurdles such as limited scalability, high cost, and undesired cross doping. These issues can be, in principle, mitigated or eliminated if an all-group-IV system becomes available. Although uncapped tensile strained Ge layer growth on GeSn has been demonstrated by several groups [16-18], studies on QWs growth are still scarce and those specifically on tensile strained Ge QWs are still missing in literature. In two recent reports, optoelectronic devices have been developed by employing Ge/GeSn multiple QW structures to implement Si-compatible light emitting diodes [23] and photodetectors [24]. However, in both cases the strain in Ge is relatively low (e.g., below 0.48%) due to the low Sn content (≤8 at %) and limited relaxation in GeSn layers used in these studies. These characteristics do not yield the quantum confinement in the Ge layer. Enhancing the strain in the Ge would enable carrier confinement and enhance their mobility. However, to achieve strain levels above 1%, numerous challenges must be overcome. One challenge concerns the growth of GeSn using a protocol allowing for both enhanced Sn incorporation and significant strain relaxation. Another challenge relates to the growth of Ge QW with sharp interfaces. Another challenge concerns the growth of GeSn barrier on tensile strained Ge at a Sn content and strain corresponding to the targeted band offset.

The quantum heterostructures, related devices and method for manufacturing the same presented in the current description all related to the aforementioned challenges. The methods provided outline a heteroepitaxy protocol leading to the growth of highly tensile-strained (>1%) Ge QW exhibiting sharp interfaces with GeSn barrier layers and high selectivity of LH confinement leading to HH and electrons to be expelled from QW.

It is to be noted that the quantum heterostructure and related devices that will be described is a versatile building block to applications related to scalable, manufacturable and CMOS-compatible technologies, such as, and without being limitative, high-mobility electronics, high hole mobility transistors, spintronics, quantum information, quantum communication, opto-electrical and magnetic sensing, hybrid quantum photonics and electronics, light hole spin devices, and quantum optoelectronics.

Quantum Heterostructures

Embodiments of a quantum heterostructure 20 will now be described with reference to FIGS. 1*a-b*. The quantum heterostructure 20 includes a stack 22 of coextending GeSn buffer layers 22*a,b*, ( . . . ), n, wherein “n” is the number of buffer layers. In the illustrated embodiment of FIG. 1*a*, the stack 22 includes two GeSn buffer layers, labeled 22*a* and 22*b*. Each GeSn buffer layer 22*a* and 22*b* has a different Sn content one from another, which means, in the case of the illustrated embodiment that the Sn content of the buffer layer 22*a* is not the same as the Sn content of the buffer layer 22*b*. In some embodiments, the Sn content of the buffer layer 22*a* can be about 7 at. % and the Sn content of the buffer layer 22*b* can be about 8.5 at. %. In other embodiments, the buffers layers could also be made of other alloys, such as, for example and without being limitative SiGeSn or CSiGeSn.

The quantum heterostructure 20 also includes a quantum well 24. The quantum well 24 extends over the stack 22 of coextending GeSn buffer layers 22*a,b*. The quantum well includes a highly tensile-strained layer 26. The highly tensile-strained layer 26 includes at least one group IV element, which can be, for example and without being limitative, germanium (Ge). The highly tensile-strained layer 26 has a strain greater than or equal to 1%. In some embodiments, the strain ranges from about 1.55% to about 2%. In one embodiment, the strain ranges from about 1.55% to about 1.75%. In one embodiment, the strain is higher than 2%.

The strain achieved in the highly tensile-strained layer 26 depends on the number of buffer layers in the stack 22, their content and their degree of relaxation. The stack 22 of coextending buffer layers generally includes between one and six layers. It is to be understood that the minimal number of layers is one, and that the maximal number of layers depends on the strain required in the highly tensile-strained layer 26. For instance, in the embodiment described above, the strain is about 1.65±0.10%, and the stack 22 includes five layers, labeled 22*a,b,c,d,e*.

The highly tensile-strained layer 26 of the quantum well 24 is sandwiched between two layers, namely a bottom barrier layer 28 and a top barrier layer 30. In the illustrated embodiments, the bottom and top barrier layers 28, 30 are GeSn barrier layers. The barrier layers 28,30 could also be made from other alloys, such as, for example and without being limitative, SiGeSn or CSiGeSn.

Figure 1B:
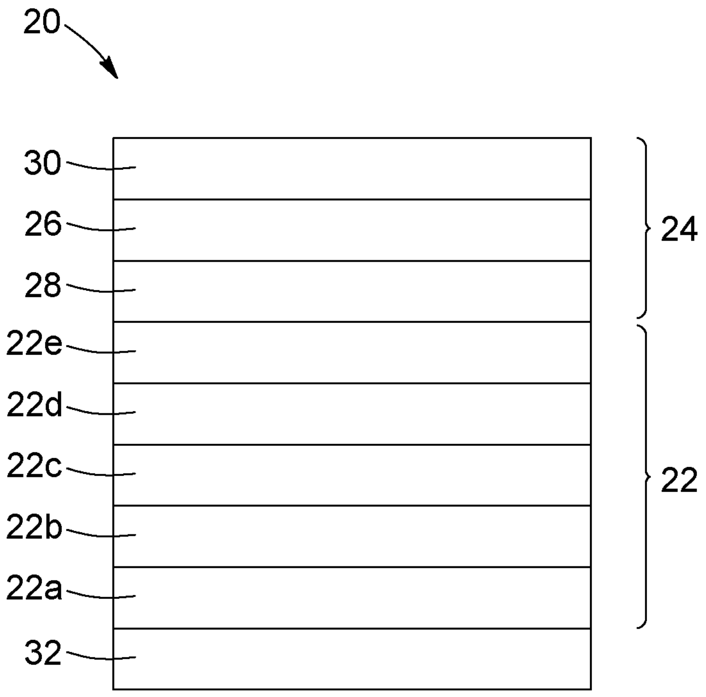

In one embodiment, illustrated in FIG. 1*b*, the quantum heterostructure 20 includes one or more buffer layers 22*a,b*, ( . . . ), n, wherein “n” is the number of buffer layers. In this embodiment, each buffer layer is made from an alloy. The expression “alloy” herein refers to a combination of at least two elements. The alloy can either be binary (combination of two elements), tertiary (combination of three elements) or quaternary (combination of four elements). The alloy of interest includes at least two group-IV elements, such as, for example and without being limitative carbon, silicon, germanium or tin. It is to be noted that the incorporation of the lighter elements of this group (e.g., C or Si along with Ge and/or Sn) generally leads to buffer layers having similar lattice parameter (i.e., lattice constant), but different bandgaps. In this embodiment, the quantum heterostructure includes a tensile-strained semiconductor layer 26' extending over the one or more buffer layers 22*a,b*, ( . . . ,), n. The tensile-strained semiconductor layer 26' is made from one group-IV element and has a strain greater than or equal to 1%. The tensile-strained semiconductor layer 26' is sandwiched between a bottom barrier layer 28' and a top barrier 30', meaning that the bottom barrier 28' layer extends over the one or more buffer layers 22*a,b*, ( . . . ,), n and that the top barrier layer 30' extends over the tensile-strained semiconductor layer 26'. The tensile-strained semiconductor 26' is generally made from germanium or silicon.

Devices

Now that the quantum heterostructure 20 has been described, examples of a device 40 will now be presented.

Figure 1C:
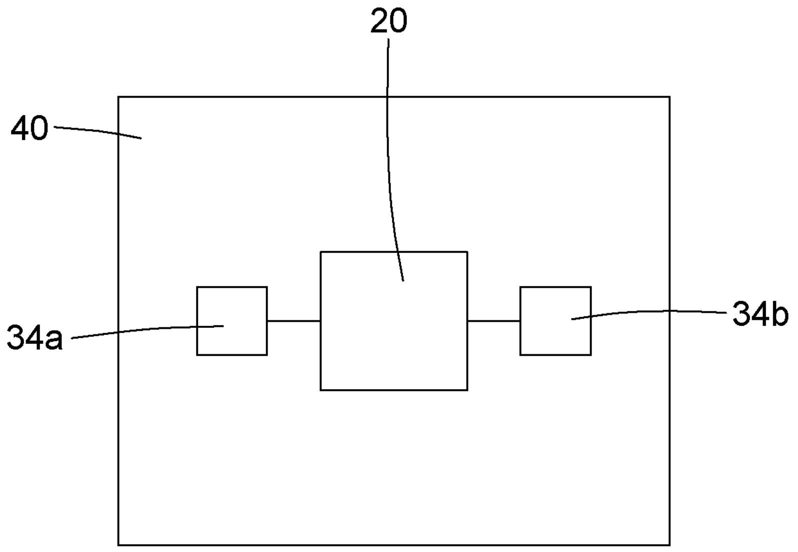

As illustrated in FIG. 1*c*, the device 40 includes a substrate 42. The quantum heterostructure 20 coats the substrate 42, meaning that the quantum heterostructure is extending over the substrate 42, and so covers at least a portion thereof. The quantum heterostructure 20 is similar to the ones which have been previously described. The stack 22 is similar and includes one or more GeSn buffer layers 22*a,b*, ( . . . ), n, wherein "n" is the number of buffer layers. Each GeSn buffer layer 22*a,b*, ( . . . ), n has a different Sn content one from another. The quantum well 24 is also similar. The quantum well 24 includes the highly tensile-strained layer 26 made from at least one group IV element. The strain in the highly tensile-strained layer 26 is greater than or equal to 1%.

The device 40 includes two or more electrodes 34*a,b* operatively connected to the quantum heterostructure 20. In the context of the current description, the expression "operatively connected" could refer, for example and without being limitative, to a direct or indirect electrical communication.

The pair of electrodes 34*a,b* are in a spaced-apart configuration. The spaced-apart configuration could either be in a vertical configuration or in a horizontal configuration. The configuration is determined as a function of the direction of the driving force of the charge transport. In the context of the following description, the vertical configuration is herein understood as the configuration enabling the charge transport to take place in a substantially vertical direction (i.e., a direction extending in a direction substantially parallel to the force of gravity), whereas the horizontal configuration is herein understood as the configuration enabling the charge transport to take place in a substantially horizontal direction (i.e., a direction extending in a direction substantially perpendicular to the force of gravity).

The device 40 could also have a multiterminal configuration and require a bottom gate electrode.

In some embodiments, the bottom barrier layer 28 and the top barrier layer 30 are each optically active.

In some embodiments, the group IV element material is Ge.

The stack 22 included in the device 40 can comprise between one and six layers. In one embodiment, the stack of coextending GeSn buffer layers comprises five layers. As it has been previously mentioned, the strain is at least about 1%. In this non-limitative embodiment, the strain ranges from about 1.55% to about 1.75%.

Figure 1D:

As illustrated in FIG. 1*d*, the substrate 32 can comprise a virtual substrate layer 36 and an original substrate layer 38. The virtual substrate layer 36 is generally made from a different material than the original substrate layer 38 and generally acts as a strain relaxed buffer. Using the virtual substrate layer 36 can be useful to grow a material having a different lattice parameter (i.e., lattice constant) than the original substrate layer 38. In the illustrated embodiments, the virtual substrate layer 36 is made from Ge and the original substrate layer 38 is made from Si including bulk Si and Si-on-insulator. The quantum heterostructure 20 can more easily grow on the virtual substrate layer 36 than on the original substrate layer 38, which notably enables the growth of a Ge-based quantum heterostructure on a Si substrate.

The nature of the substrate can vary. For example, and without being limitative, the substrate can be a Ge-on-insulator (GOI) wafer, a compound semiconductor wafer, a compound semiconductor layer grown on Si, a compound semiconductor layer grown on Ge, a compound semiconductor layer grown on SOI and a compound semiconductor layer grown on GOI. In some embodiments, the substrate is selected from GaP, GaAs, GaSb, InP, InAs InSb, ZnS, ZnSe, CdS, CdSe, ZnTe, CdTe, WSe and their alloys.

It is to be noted that the device 40 can be implemented or act as a building block for a broad variety of applications. For example, and without being limitative, the device 40 described herein could be used in ultrafast transistors and other devices that may find application in optoelectronics, quantum information, spintronics, energy conversion, sensing and imaging, and hybrid photonics-electronics.

Depending on the targeted application, a dielectric layer could be added on top the quantum heterostructure 20, i.e., on the outermost surface of the top barrier layer 30. Alternatively, a metal/dielectric could also be provided on top of the quantum heterostructure 20. Similarly, insulating layer(s) could be added when required by the processing of the devices.

The contacts, which have been represented in a nonlimitative embodiment as being a pair of electrodes 34*a,b*, could of course vary in terms of design, size, geometry, numbers and/or composition. For instance, the contacts could be connected with any portions of the device 40 and/or quantum heterostructure 20. For example, and without being limitative, the contacts could be connected with one or more of the buffer layers 22*a,b*, ( . . . ), n, the highly tensile-strained layer 26 the bottom barrier layer 28, the top barrier layer 30, the substrate 32, other additional layers (e.g., dielectric, metallic and/or insulating layers provided in the device) and/or any combinations thereof.

Methods

Now that different embodiments of the quantum heterostructure 20 and related devices have been described, different methods for preparing and manufacturing the same will now be presented.

Figure 9:
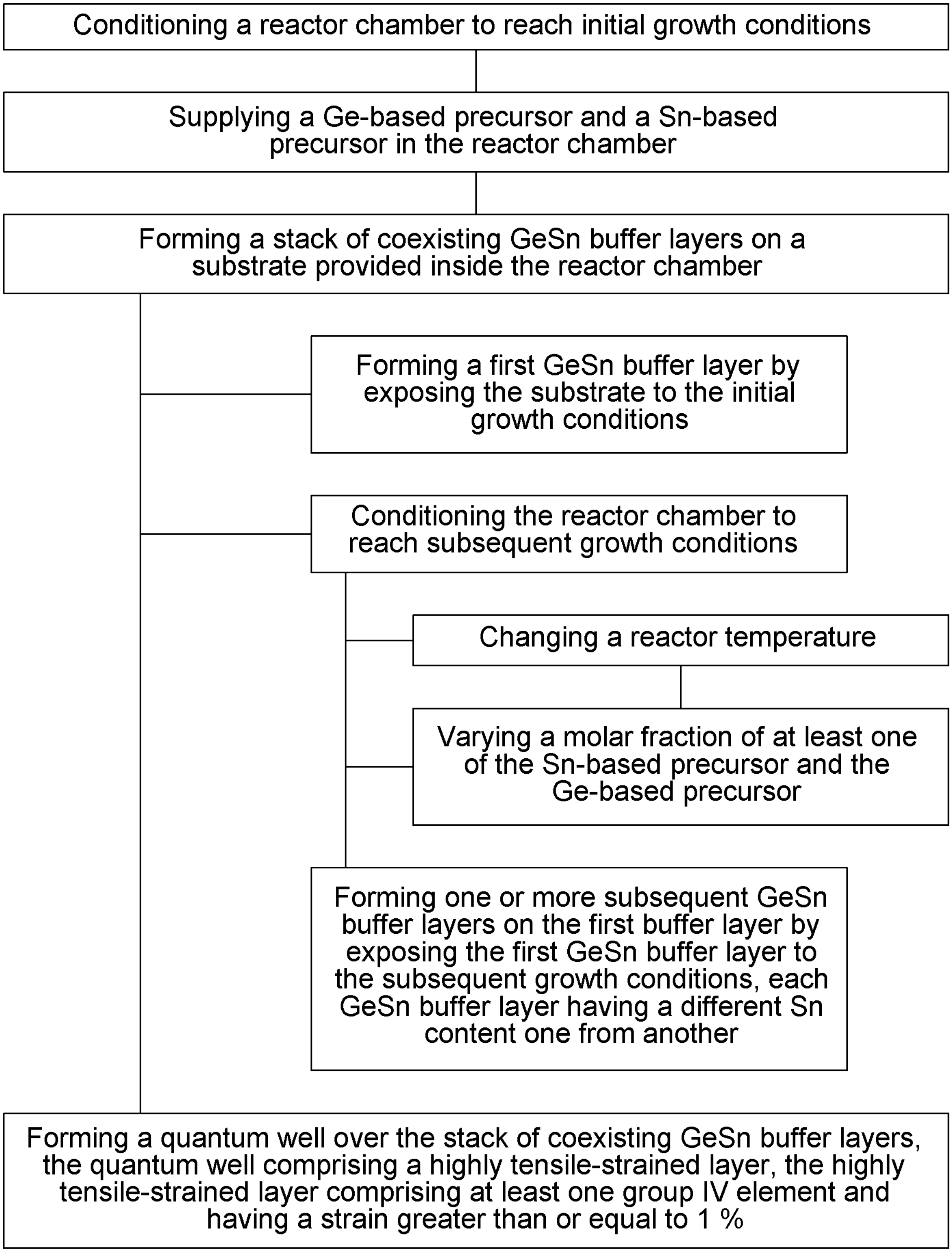
FIG. 9 is a flowchart presenting a method for manufacturing a quantum heterostructure, in accordance with one embodiment.

A method for preparing a quantum heterostructure will now be described. Some steps of this method are illustrated in FIG. 9.

The method includes the steps of conditioning a reactor chamber to reach initial growth conditions; supplying a Ge-based precursor and a Sn-based precursor in the reactor chamber; forming a stack of coextending GeSn buffer layers on a substrate provided inside the reactor chamber, and forming a quantum well over the stack of coextending GeSn buffer layers, the quantum well comprising a highly tensile-strained layer, the highly tensile-strained layer comprising at least one group IV element and having a strain greater than or equal to 1%.

The step of forming a stack of coextending GeSn buffer layers on a substrate provided inside the reactor chamber includes forming a first GeSn buffer layer by exposing the substrate to the initial growth conditions; conditioning the reactor chamber to reach subsequent growth conditions; and forming one or more subsequent GeSn buffer layers on the first buffer layer by exposing the first GeSn buffer layer to the subsequent growth conditions, each GeSn buffer layer having a different Sn content one from another.

The step of conditioning the reactor chamber to reach subsequent growth conditions includes changing a reactor temperature; and varying a molar fraction of each group IV precursor, such as for example and without being limitative, Sn and Ge.

In some embodiments, growing the stack of coextending GeSn buffer layers and growing the highly tensile-strained quantum well are each carried out with an epitaxial growth method. For example, and without being limitative, the epitaxial growth method can be a low-pressure chemical vapor deposition method.

In some embodiments, the method further includes preparing the substrate. This step includes growing a virtual substrate layer on an original substrate layer. In some embodiments, the step of growing the virtual substrate layer is carried out at a temperature ranging from about 460° C. to about 600° C. and further comprises thermally treating the virtual substrate layer at a thermal treatment temperature greater than or equal to 800° C.

In some embodiments, each buffer layer is grown at a substantially constant reactor pressure, a substantially constant $H_2$ flow and a substantially constant molar fraction of the Ge-based precursor.

In some embodiments, the Ge-based precursor is $GeH_4$ or other hydrides and the Sn-based precursor is $SnCl_4$ or other hydrides.

In some embodiments, the step of changing the reactor temperature includes reducing the temperature and said varying the molar fraction of each group IV precursor (e.g., Ge and Sn) includes reducing the molar fraction of the precursors.

There is also provided a method for manufacturing a device. The method includes preparing a quantum heterostructure according the steps which have been presented above and operatively connecting the quantum heterostructure to a pair of electrodes.

In some embodiments, the method includes one or more of the following steps and may follow what will be referred to as a "growth protocol" using low-pressure chemical vapor disposition.

or more of the following steps and may follow what will be referred to as a "growth protocol" using low-pressure chemical vapor disposition.

Figure 2A:
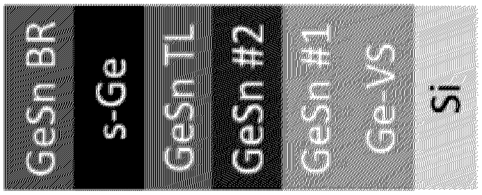
FIG. 2*a* includes schematics of the tensile-strained germanium (Ge) QW imbedded in germanium-tin (GeSn) multi-layer stacking grown on a Ge/Si substrate (known as Ge-virtual substrate, Ge-VS)

To achieve a relatively precise control of the lattice parameter, the growth of the stack 22 of GeSn buffer layers with variable Sn content on silicon wafer has been developed and optimized, as illustrated in FIG. 2*a*.

The Ge/GeSn QW heterostructures can be grown on the virtual substrate layer 36, which can be a Ge epitaxial layer deposited on a silicon wafer, acting as the original substrate layer 38. The two-step growth of germanium virtual substrate layer 38 was performed in the 460 to 600° C. temperature range, followed by thermal cyclic annealing above 800° C. The GeSn layers were grown at a reactor pressure of 50 Torr, constant $H_2$ flow and GeH4 molar fraction ($1.2 \cdot 10^{-2}$), and the composition was controlled by the temperature change. In addition, the initial molar fraction of the $SnCl_4$ precursor ($9.1 \cdot 10^{-6}$) was reduced by ca. 20% during each temperature step to compensate for the reduced $GeH_4$ decomposition with decreasing temperature. Two different sets of samples at a different strain in the s-Ge QW 24 were grown. In the first set of samples, two GeSn buffer layers with compositions of 7 at. % and 8.5 at. % were grown at 320° C. (labelled layer #1) and 310° C. (labelled layer #2), respectively. Next, the GeSn bottom barrier layer 28 with a graded composition from 10.5 at. % to 12 at. % was grown at 300° C. The temperature was then raised back to 320° C., while increasing the $GeH_4$ supply ($4.2 \cdot 10^{-2}$) and the chamber pressure to 80 Torr for the s-Ge layer (referred to as the "highly tensile-strained layer 26) growth. The thickness of Ge quantum well 24 is controlled by tuning the growth time. FIG. 2 shows example of tensile-strained Ge QWs obtained at different growth times of 45, 25, 15, and 8 minutes. Once the growth of the highly tensile-strained layer 26 was completed, the sample was cooled down to 300° C. and the GeSn growth resumed for the top barrier layer 30 (sometimes referred to as a "GeSn barrier (BR) layer") growth, with the same parameters as used in the bottom barrier layer 30 (sometimes referred to as the "top layer"), except for a reduced growth time. The number of buffer layers 22*a,b*, ( . . . ), n (e.g., GeSn buffer layers) and their composition can be used to control the strain in the QW 24. A case where 5 GeSn layers are used leading to more than 60% increase in the tensile strain will be described later. In that example, the five GeSn buffer layers were grown at 340° C. (labelled layer #1), 330° C. (labelled layer #2), 320° C. (labelled layer #3), 310° C. (labelled layer #4), and 300° C. (labelled layer #5) with a variable thickness. Next, the bottom barrier layer 28 was grown at 290° C., followed by the highly tensile-strained layer 26 growth at 320° C. and an additional GeSn growth for the top barrier layer 30 at 290° C.

In some embodiments, the method includes n-type or p-type doping of at least one layer during the epitaxial growth.

In some embodiments, the n-type doping of at least one layer is achieved by using arsenic, antimony, or phosphorus chemical precursors.

In some embodiments, the p-type doping of at least one layer is achieved by using boron, aluminum, or gallium chemical precursors.

In some embodiments, the quantum heterostructure includes a p-n junction or p-i-n junction.

Experimental Results

Now referring to FIGS. 2 to 7, experimental results will now be presented to illustrate the working principle and different features of the quantum heterostructures which have been described in previous sections.

Figure 2B:
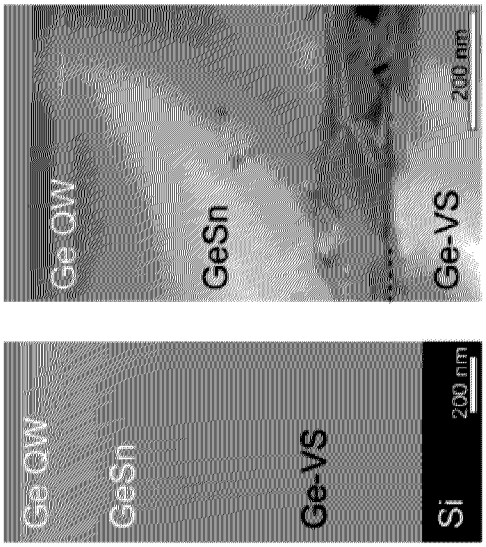
FIG. 2*b* is a low-resolution transmission electron microscopy (TEM) image of the grown heterostructure.
Figure 2C:
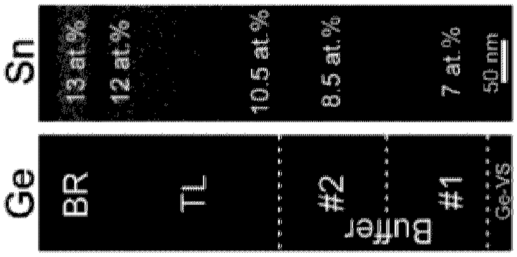
FIG. 2*c* is an electron energy loss spectroscopy (EELS) elemental mapping for the Ge, Sn, and C atoms.
Figure 2D:
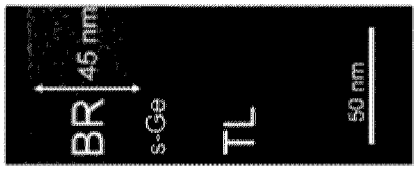
FIGS. 2*d*-*g* are high-resolution EELS maps of the 11 nm, 9.5 nm, 8.0 nm, and 4.5±0.2 nm Ge QWs, respectively.
Figure 2E:
Figure 2F:
Figure 2G:
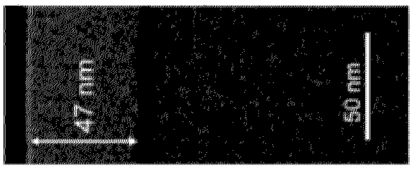

A schematic of the quantum heterostructure is illustrated in FIG. 2*a*. In terms of abruptness of the heterostructure interfaces, a TEM image acquired on a typical as-grown s-Ge QW heterostructure is shown in FIG. 2*b*. As it can be seen, defects and dislocations in GeSn are mainly observed in the proximity, i.e., near or at the interface with the Ge-VS. A low-defect zone or an almost defect-free zone is observed GeSn/Ge/GeSn QW region on top. The expressions "low-defect zone" and "almost defect-free zone" herein refer to the fact that a relatively low number of defects are present or alternatively cannot be observed at the TEM imaging scale near the QW. With reference to FIG. 2*c*, an EELS map is displayed. The map indicates the Sn content values in each layer. It is to be noted that the Sn content values were obtained from RSM measurements and are also provided across the stacking. The increase in Sn content across the GeSn buffer layers (#1-2) and TL results from the reduction in temperature during GeSn growth, as it has been described previously. In the illustrated embodiment, the first buffer layer has an Sn content of about 7 at. % and the second buffer layer has an Sn content of about 8.5 at. %. In addition, the graded composition from about 10.5 at. % to about 12.5 at. % in the bottom barrier layer originates from the strain relaxation during growth. The strain relaxation facilitates the incorporation of Sn in the growing layer, as the layer grows. The length of the quantum well can be varied. As illustrated in FIGS. 2*d-e*, quantum heterostructures having a s-Ge layer of different thickness have been prepared. In FIG. 2*d*, the 12.5 nm-thick s-Ge layer has a substantially homogenous thickness and presents substantially flat interfaces, as visible in the EELS map. One will note that Sn atoms are not detected in the layer, thus confirming the composition of the QW layer. A 0.5-1 at. % increase in Sn content is measured in the top barrier layer when compared to the bottom barrier layer, despite the use of identical growth conditions. The thickness of the QW is controlled by the growth time at 320° C. As illustrated in FIGS. 2*e-g*, other QW layers with different thicknesses have been prepared, ranging from about 4 nm to about 11 nm. The samples prepared with a thickness of 12.5±0.5 nm, 10.5±0.5 nm, and 7.5±0.5 nm, are shown in the high-resolution EELS images in FIGS. 2*d-f*, where no detectable signal associated with the presence of Sn atoms was measured in the quantum well (i.e., the strained Ge layer) for all samples. Now turning to FIG. 2*g*, the thinnest s-Ge layer (growth time: 8 minutes) is shown. It is to be noted that the dimension of this layer is below the resolution limit of the EELS, and so the s-Ge layer thickness of 4.5±0.5 nm has been estimated from a Gaussian fit of the EELS profile. The thickness of the top barrier layer is in the 35-50 nm range for all samples.

The abruptness of the GeSn—Ge interface is evaluated by plotting the Ge EELS intensity for all samples in FIG. 3*a*. The width of the Ge—GeSn interface was fitted using a sigmoidal function:

$$f(x) = A + \frac{B}{1 + e^{-\frac{x_0 \pm x}{\tau}}} \tag{1}$$

where A is a vertical offset parameter (Ge content in the TL or BR) layer, B is a scaling parameter (maximum Ge content), $x_0$ is the inflection point of the curve, and the sign of x results in an increasing or decreasing function. The interface width w is then estimated as $4_{T}$. From the fit of the EELS profile the QW thickness t is estimated a $x_0^{BR} - x_0^{TL}$. The results for the fit are shown in FIGS. 3*b-c*.

In the 7.5 nm-thick QW layer, the interface width w is ~1.1 nm for both interfaces with the GeSn bottom barrier layer and top barrier layer. This indicates that a negligible contribution from the reservoir of residual Sn atoms at the surface after the TL growth is observed, and so that no significant Ge—Sn intermixing occurs up to a growth time of 15 minutes. Thus, the method for preparing the quantum heterostructures heterostructure provides relatively sharp interfaces and high chemical purity for the QW layer for thicknesses substantially equal or below 10 nm. It is to be noted that the interface width values can be considered as a lower limit considering the spatial resolution of the EELS technique. In addition, the higher Sn content in the bottom barrier layer and the top barrier layer does not modify the sharpness of the interface, indicating that the growth of the QW is not affected by the composition of the GeSn layers.

In compressively strained (−0.63%) Ge/SiGe QWs, an interface width with a characteristic distance λ≥0.8 nm was estimated using the following function:

$$f(x) = \frac{1}{2} Erf\left(\frac{x - x_0}{\sqrt{2}\lambda}\right) \tag{2}$$

By fitting the EELS profile for the 7.5 nm QW (FIG. 3*a*) with equation 2, the characteristic distance λ is estimated to be about 0.4 nm and 0.5 nm for the bottom barrier layer/Ge QW layer and Ge QW layer/top barrier layer interfaces, respectively, hence with lower values compared to compressively-strained Ge QW samples.

Now turning to FIGS. 4*a-d*, the crystalline quality of the QW and the coherent Ge QW epitaxy will now be discussed.

Figure 4A:
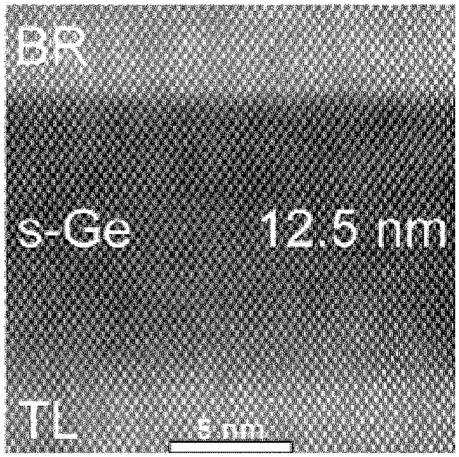
FIG. 4*a* includes a high-resolution TEM (HRTEM) image of the 11.0 nm thick QW. Insets: FFT acquired at the BR, s-Ge, and TL layers.
Figure 4B:
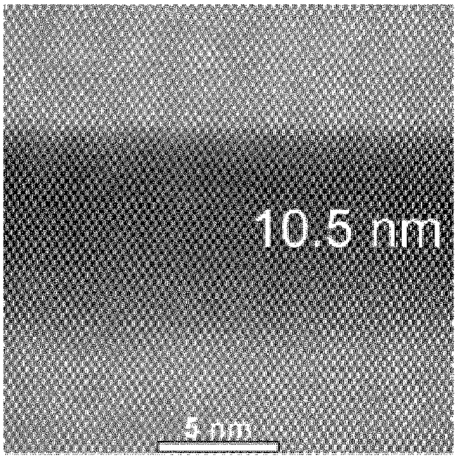
FIG. 4*b* is a HRSTEM image of the s-Ge layer.
Figure 4C:
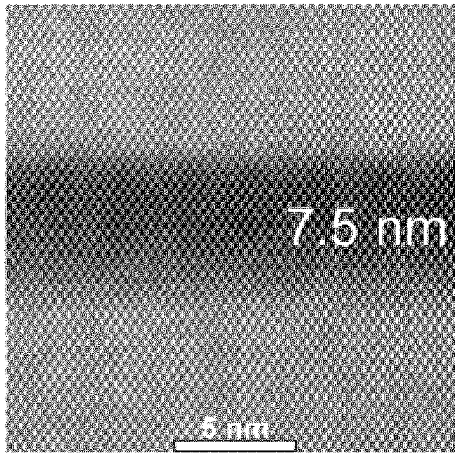
FIGS. 4*c*-*e* are HRTEM images of the 9.5 nm, 8.0 nm, and 4 nm QWs, respectively.
Figure 4D:
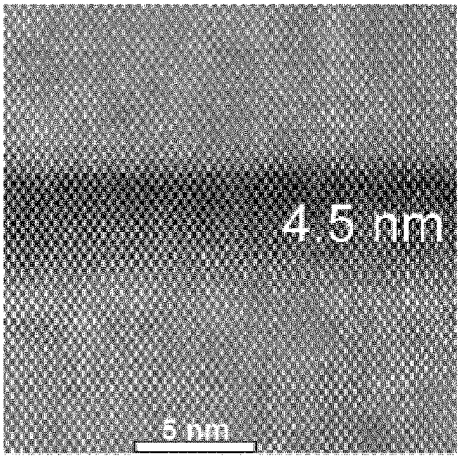
Figure 4E:
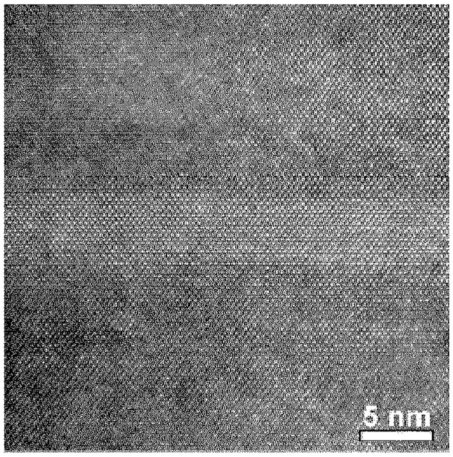
Figure 4F:
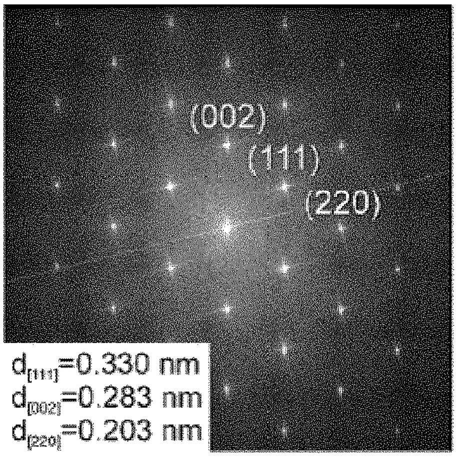

High crystalline quality of the Ge layer is observed across the QW having a thickness of about 12.5 nm, 10.5 nm, the 7.5 nm and the 4.5 nm, as shown in the HRSTEM images provided in FIGS. 4*a-d*. Little to no defects are visible across the heterostructures, which is indicative of the pseudomorphic nature of the Ge QW with respect to the bottom barrier layer and the top barrier layer. In the selective-area electron nanodiffraction (nano-SAED) analysis performed on the quantum heterostructure and illustrated in FIG. 4*e*, the absence of splitting of the diffraction spots and additional satellite spots indicates that a coherent epitaxial growth of the Ge QW with respect to the bottom barrier layer and the top barrier layer is achieved. To further confirm this assumption, no changes in the nano-SAED, acquired on each individual layer and illustrated in FIG. 4*f*, are visible, which further support that the zone axis is maintained across the heterostructure and that the in-plane lattice parameter of the QW layer coincides or is at least substantially the same as the one of bottom barrier layer and the top barrier layer. The coherent growth shows that the in-plane lattice parameter of the bottom barrier layer is maintained in the Ge QW and further preserved after the growth on top barrier layer, thus indicating the tensile-strained nature of the Ge layer in all analyzed samples. These results support the quality and reproducibility of the method which has been previously described.

Figure 5:
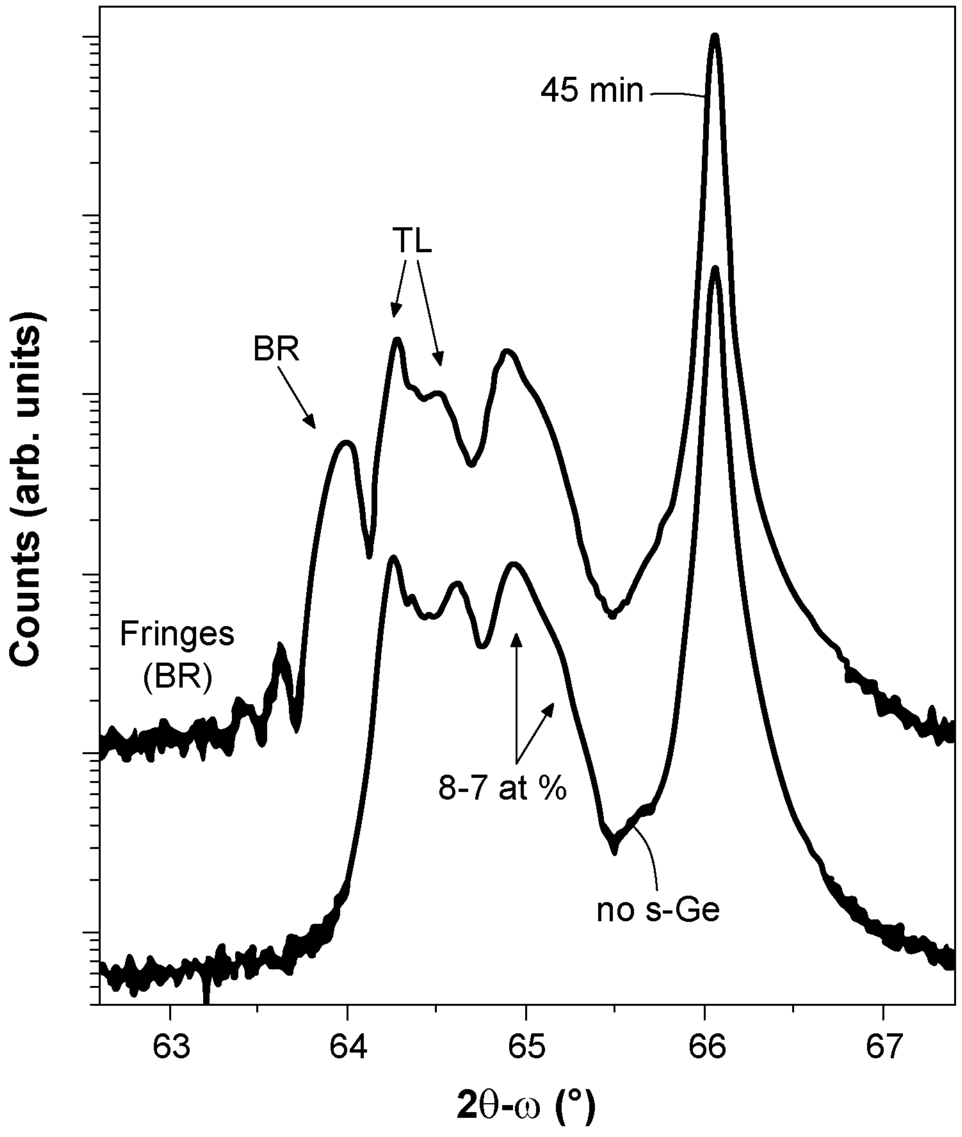
FIG. 5 shows 2θ-ωscans around the (004) X-ray diffraction order for the 11.0 nm-thick QW and the reference stacking without the QW.

The effect of the coherent Ge QW growth on the GeSn layers is visible in the XRD (004) symmetric scan illustrated in FIG. 5. In the reference sample without the s-Ge layer the GeSn-related peaks are observed between 64.2° and 65.5°, with the bottom barrier layer and the top barrier layer peaks being both at 64.25°. When the 12.5 nm-thick QW is introduced in the stacking, the top barrier layer peak shifts to 64.0° while the bottom barrier layer peak remains at ca. 64.25°. In addition, Pendellosung fringes are observed below 64.0°. These fringes originate from the phase shift between the scattered waves induced by the variation in the out-of-plane lattice parameter across the top barrier layer/s-Ge/bottom barrier layer stacking. The presence of Pendellosung fringes indicates a higher crystallinity in the quantum heterostructures compared to known systems based on compound semiconductors.

In terms of composition and strain in the quantum well included in the quantum heterostructure, these characteristics have been estimated using RSM measurements around the asymmetrical (224) XRD reflection. The RSM map of the 12.5 nm-thick OW is shown in FIG. 6*a*. The relatively highly-relaxed and relatively low-Sn content 7-8 at. % Sn layers (referred to as being the "buffer layers") are visible, with a residual in-plain strain $\varepsilon_{\parallel}$ being lower than −0.3%. The compositional grading of the bottom barrier layer is observed from 10.5 at. % to 12 at. %, which results in $\varepsilon_{\parallel}=-0.7\%$ at the highest Sn incorporation. The top barrier layer signal is pseudomorphic to the 12 at. % bottom barrier layer, but with an increased incorporation of 13 at. % ($\varepsilon_{\parallel}=-0.9\%$), which is in agreement with the more intense EELS signal in the top barrier layer (see for example FIGS. 2*c-d*) and with the shift to lower angles in the XRD (004) symmetric scan (see for example FIG. 5). Due to the coherent growth of the QW layer as demonstrated by the HRSTEM analysis (see for example FIG. 4), the RSM peak for the s-Ge is expected with the same $q_x$=4.945±0.050 $nm^1$ value of the bottom barrier layer and the top barrier layer. However, due to the very small thickness of the QW layer, estimating its signal in the RSM map is challenging, as it partially overwhelmed by the Ge-VS broad peak. By comparing high resolution RSM maps of the Ge-VS peak region with a sample grown without the QW layer (see for FIG. 5*b*), a broadening of the Ge-related peak is observed, showing a maximum intensity in correspondence of $q_x$ value of the TL and BR layers, as expected for pseudomorphic QW growth to these layers. From the RSM map an in-plane lattice $\alpha_{\|}$=5.720±0.050 Å is estimated for the QW layer, which results in an in-plane tensile strain $\varepsilon_{\|}$=1.1±0.1%. Since a precise value for the $q_z$ for the QW peak cannot be obtained from the RSM map, the out-of-plane lattice parameter $\alpha_{\perp}$ cannot be determined. It is noted that by promoting the relaxation of the 12-13 at. % bottom barrier layer and the top barrier layer, the strain in the Ge QW could be further increased up to ~1.7%, and any increase in Sn incorporation would further enhance the amount of tensile strain.

The EELS, RSM, and XRD measurements indicate an increase in Sn content in the top barrier layer of ca. 1 at. % after s-Ge growth, while keeping the same growth conditions of the bottom barrier layer. The effect of the substrate in-plane lattice constant on the incorporation of Sn is a well-established phenomenon. However, since the Ge QW has the same in-plane lattice constant of the bottom barrier layer, no change in Sn content would be expected in the top barrier layer grown on top. The observed behavior might be related to a change in surface energy for the pure Ge-terminated surface compared to the case of the GeSn alloy. However, no calculations are available on this topic so far. Similar changes in the alloy composition were observed during InGaN growth on lattice-mismatch substrates, where either Ga or In atoms are pulled out of the lattice to stabilize the growth at the equilibrium $x_{Ga,In}$=0.5 composition. Therefore, an alternative scenario could be considered where the perturbation in the GeSn out-of-plane lattice parameter is induced by the s-Ge, which leads to Ge atoms being pulled out of the GeSn lattice, thus facilitating the incorporation of Sn atoms in the top barrier layer. This would imply that the chosen growth condition for the GeSn top barrier layer would lead to an equilibrium composition of 13 at. % (i.e. ~1 at. % higher than TL) that is reached by reducing the number of Ge atoms in the GeSn lattice after s-Ge growth.

Now turning to FIGS. 7*a-g*, the strain tunability in the QW and the process robustness will now be described.

Figure 7A:
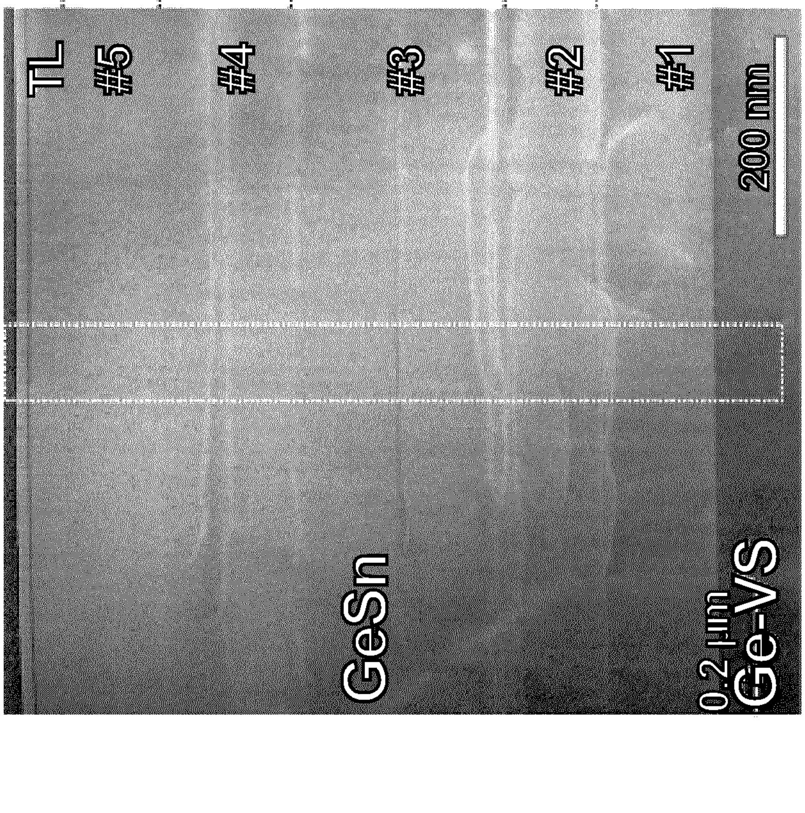
FIG. 7*a* shows a low-resolution TEM image of the Ge QW with tensile strain as high as 1.65±0.10%.
Figure 7B:
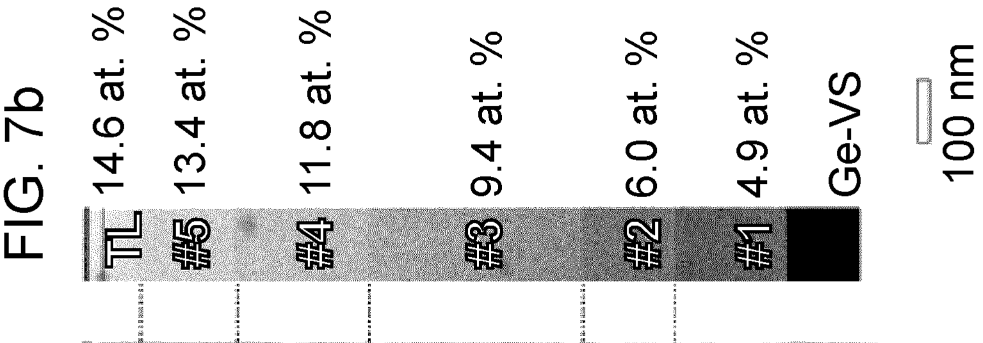
FIG. 7*b* is an EELS elemental mapping for the Ge and Sn atoms.
Figure 7C:
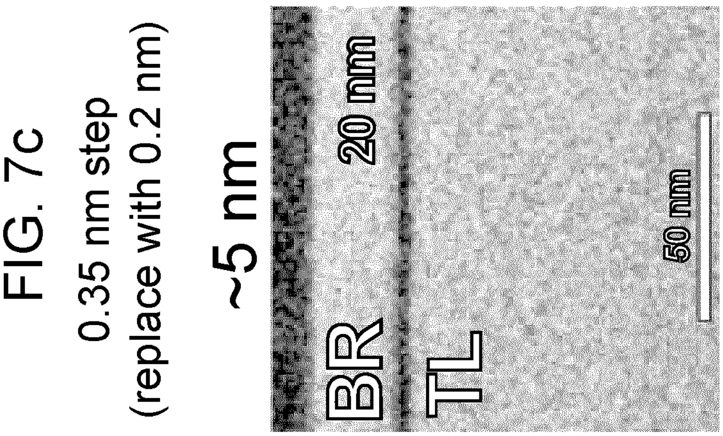
FIG. 7*c* shows a high-resolution EELS map of the 5 nm s-Ge QW.
Figure 7E:
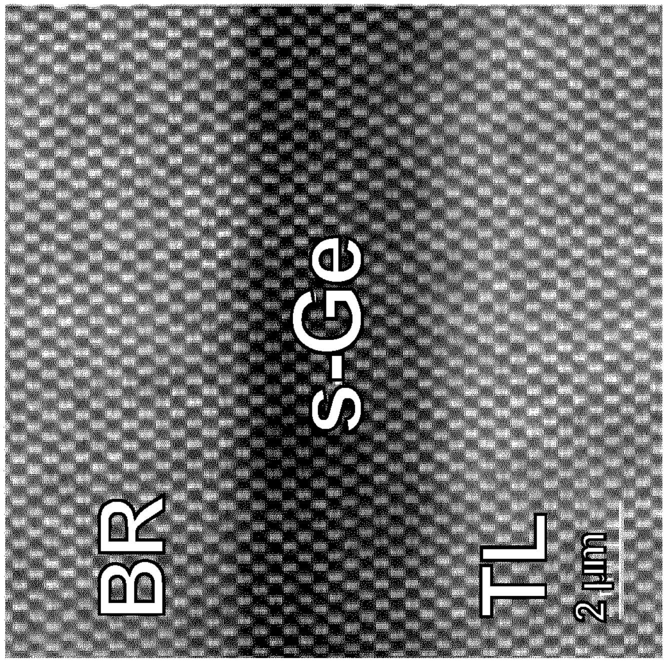
FIG. 7*e* is a HRSTEM image.
Figure 7D:
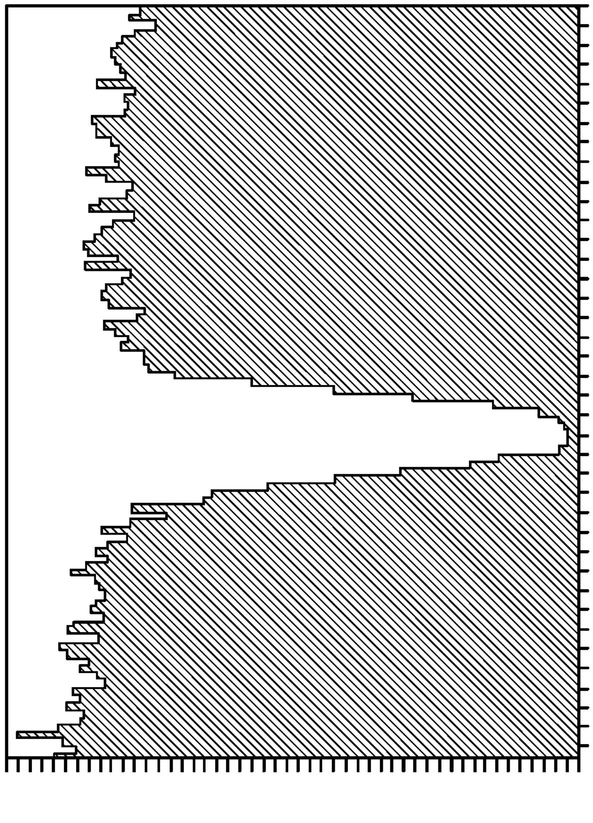
FIG. 7*d* is a plot of the EELS profile for the Ge atoms across the QW. Solid lines are the fits using equation 1.
Figure 7G:
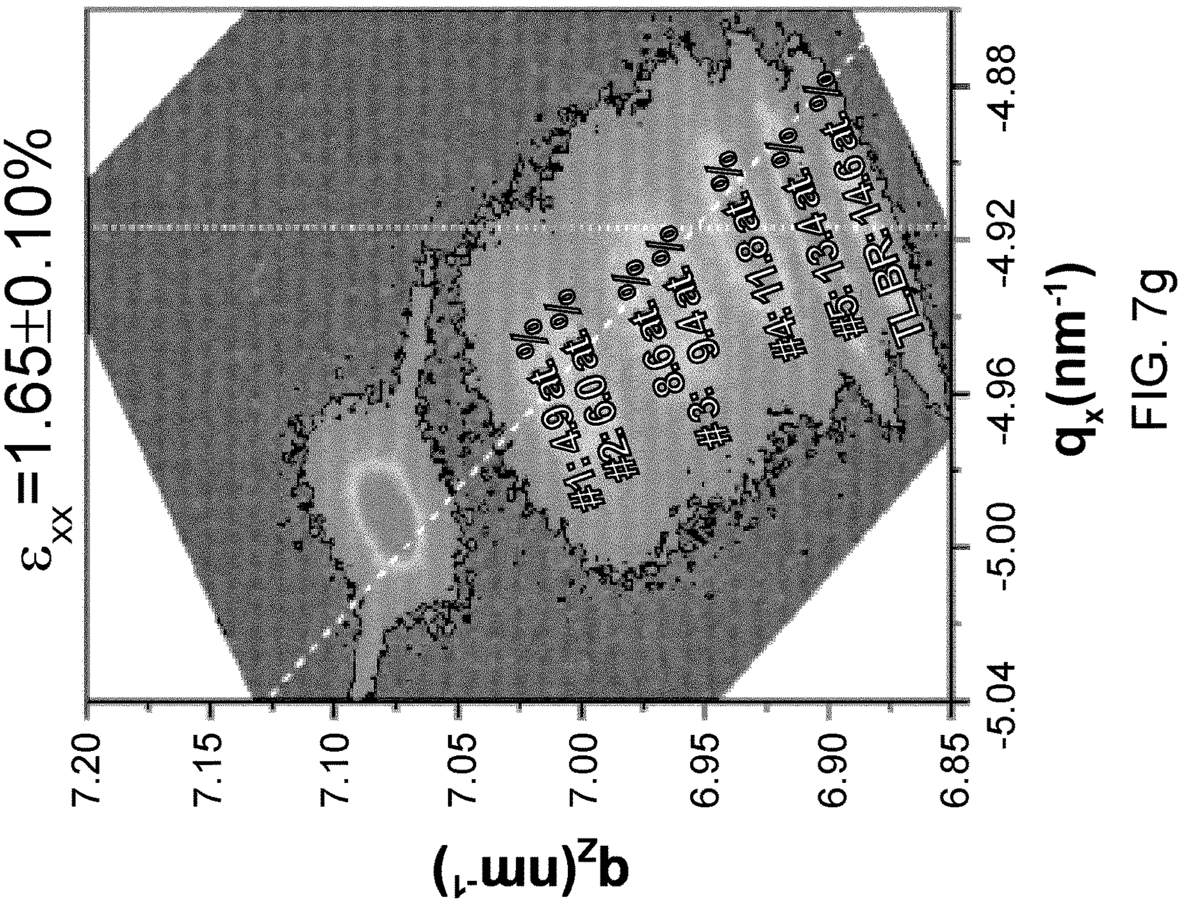
FIG. 7*g* is a RSM around the asymmetrical (224) reflection.
Figure 7F:
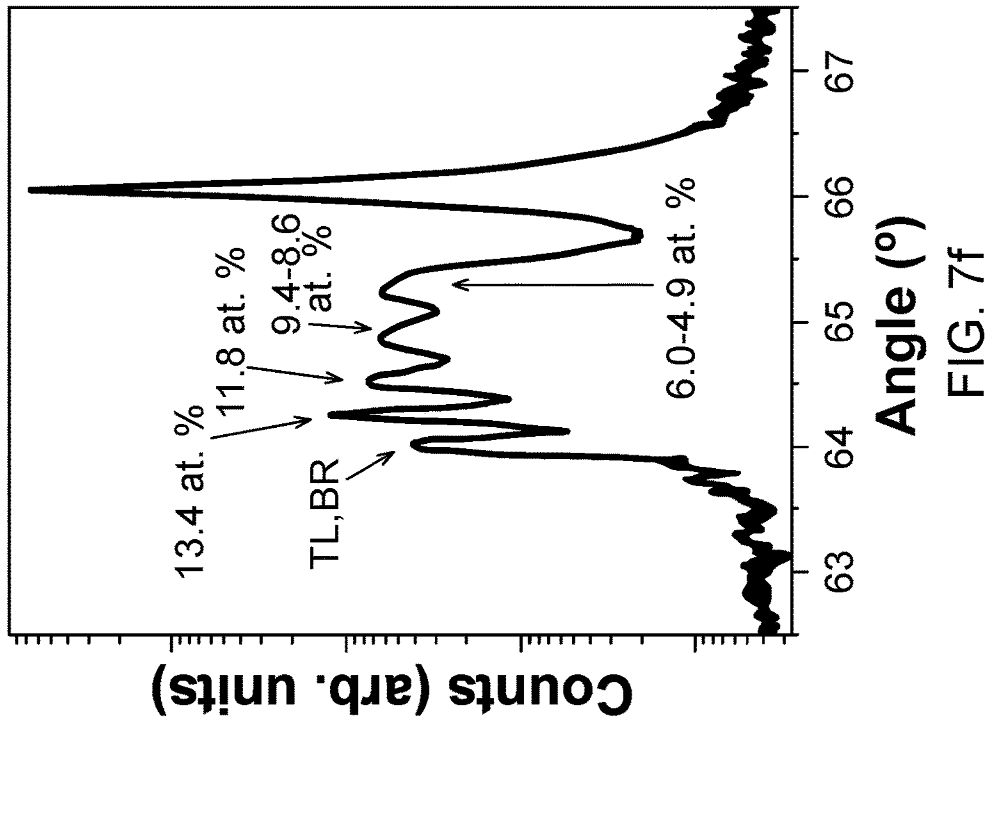
FIG. 7*f* is a 2θ-ωscan around the (004) X-ray diffraction order.

By increasing the thickness and the number of GeSn buffer layers, the strain relaxation in the bottom barrier layer is promoted, resulting in a higher strain in the s-Ge layer. A demonstration of this process is shown in FIG. 7*g*, where a strain as high as $\varepsilon_{xx}$=1.65±0.10% is achieved in the QW. In this implementation, five GeSn buffer layers with increased thickness (and Sn content from about 4.9 at. % to about 13.4 at. % were used for the growth of the 14.6 at. % bottom barrier layer, as illustrated in FIG. 7*a*. The gliding of misfit dislocations at the interface between GeSn layers with different Sn content is promoted rather than the propagation/nucleation of threading dislocations through the stacking. A similar behavior was observed in step-graded GeSn growth. This results in a high crystalline quality of the 13.4 at. % (#5) and 14.6 at. % bottom barrier layer, hence in the s-Ge QW region of the stacking where no dislocation are observed (at the TEM imaging scale). The EELS map of the s-Ge QW region grown on top, illustrated in FIG. 7*c*, shows the presence of a 5 nm-thick s-Ge layer and a 20 nm-thick top barrier layer. From fitting the line-profile for the Ge content (see FIG. 7*d*) using equation (1), an interface width w=~1 nm is estimated for both interfaces. This value is similar to what estimated in the lower strained s-Ge QWs (see FIG. 2). The coherent interface in the s-Ge QW is shown in the HRSTEM image in FIG. 8*e*, where no defects are visible at the interface with the bottom barrier layer, the top barrier layer and within the s-Ge layer. In the (004) XRD scan illustrated in FIG. 7*f* sharp peaks associated with the multiple GeSn buffer layers are visible at angles higher than 63.9°. By fitting the whole XRD spectrum using multiple Voigt functions, FWHM values of only $w_G$=53.5±0.3° and $w_L$=39.5±0.3° are obtained for Gaussian and Lorentian component, respectively, of the 13.6 at. % layer (corresponding to the fifth layer, labelled "#5") peak. As a comparison, value of $w_G$=35.4±0.2° and $w_L$=15.4±0.3° are estimated for the Ge-VS. It is to be noted that despite the growth of a 600-700 nm-thick and highly-relaxed multiple-buffer layer (corresponding to layer #1 to layer #5) stacking, the $w_G$ and $W_L$ for the TL are only ~1.5× and ~2.5× higher, respectively, than in the Ge-VS. It is also worth mentioning that it is typically assumed that non-uniform strain (i.e., leading to defects) is described by a Gaussian function, while the finite size of the crystal grains (i.e., mosaicity) can be addressed by a Lorentzian function. Thus, the growth of a GeSn multi-layer heterostructure (corresponding to layer #1 to layer #4) on the Ge-VS results in a GeSn substrate (corresponding to layer #5) without a significant amount of additional dislocations (see FIG. 2*b*) and limited increase in the mosaicity of the layer, most likely related to the increased surface roughness compared to the Ge-VS (0.9-1.0 nm). In addition, the Pendellosung fringes (63.5-63.9°) are visible but with a low intensity as a result of the limited BR thickness of 20 nm, further indicating high crystallinity of the Ge QW heterostructure. In the (224) RSM map at angles (see for example FIG. 7*g*), the GeSn buffer layers with a Sn content from 4.9 at. % (layer #1) up to 11.8 at. % (layer #4) have a high degree of strain relaxation, while the 13.4 at. % layer (layer #5) and the 14.6 at. % bottom barrier layer have the same $q_x$ parameter as the 11.8 at. % layer below. This observation is in agreement with the absence of dislocation in these two layers, as previously highlighted in FIG. 7*a*. By considering a $$q_x^{TL,BR} = 4.917\ \text{nm}^{-1},$$

an in-plane strain $\varepsilon_{xx}$=1.65±0.10% is estimated for the s-Ge QW heterostructure. It is to be noted that that the enhanced strain relaxation in the low Sn content from about 4.9 to about 11.8 at. % buffer layers (layers #1 to /4) results in the absence of compositional grading in the 13.4 at. % layer (layer #5) and the 14.6 at. % bottom barrier layer.

The results in FIG. 7 support the robustness of the method which has been previously described (the "Ge QW growth protocol") to achieve high-quality tensile strained quantum heterostructures across a multiple range of strain values.

Figure 8A:
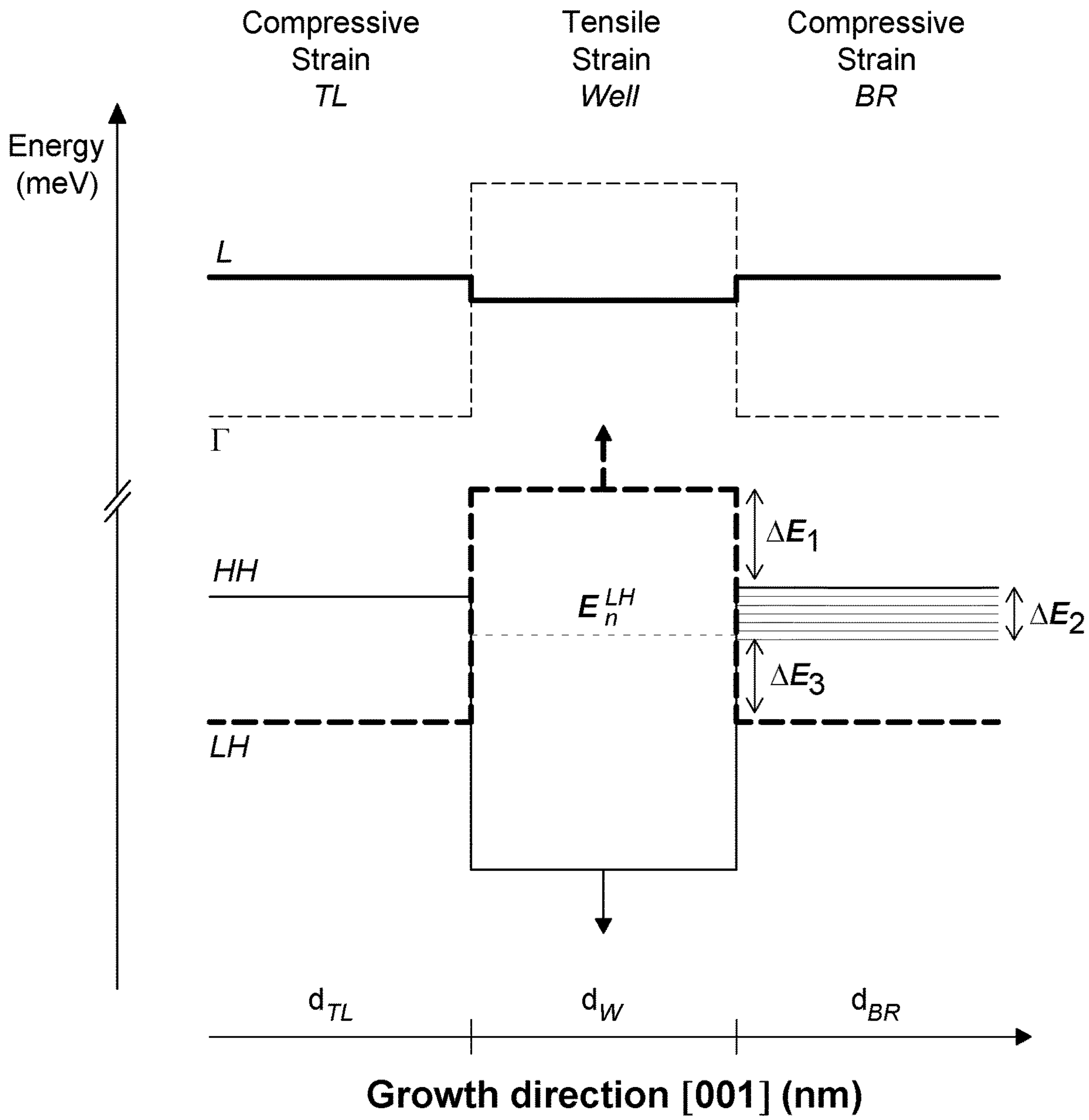
FIG. 8 is the calculated band structure diagram of the obtained heterostructures using empirical parameters.
Figure 8B:
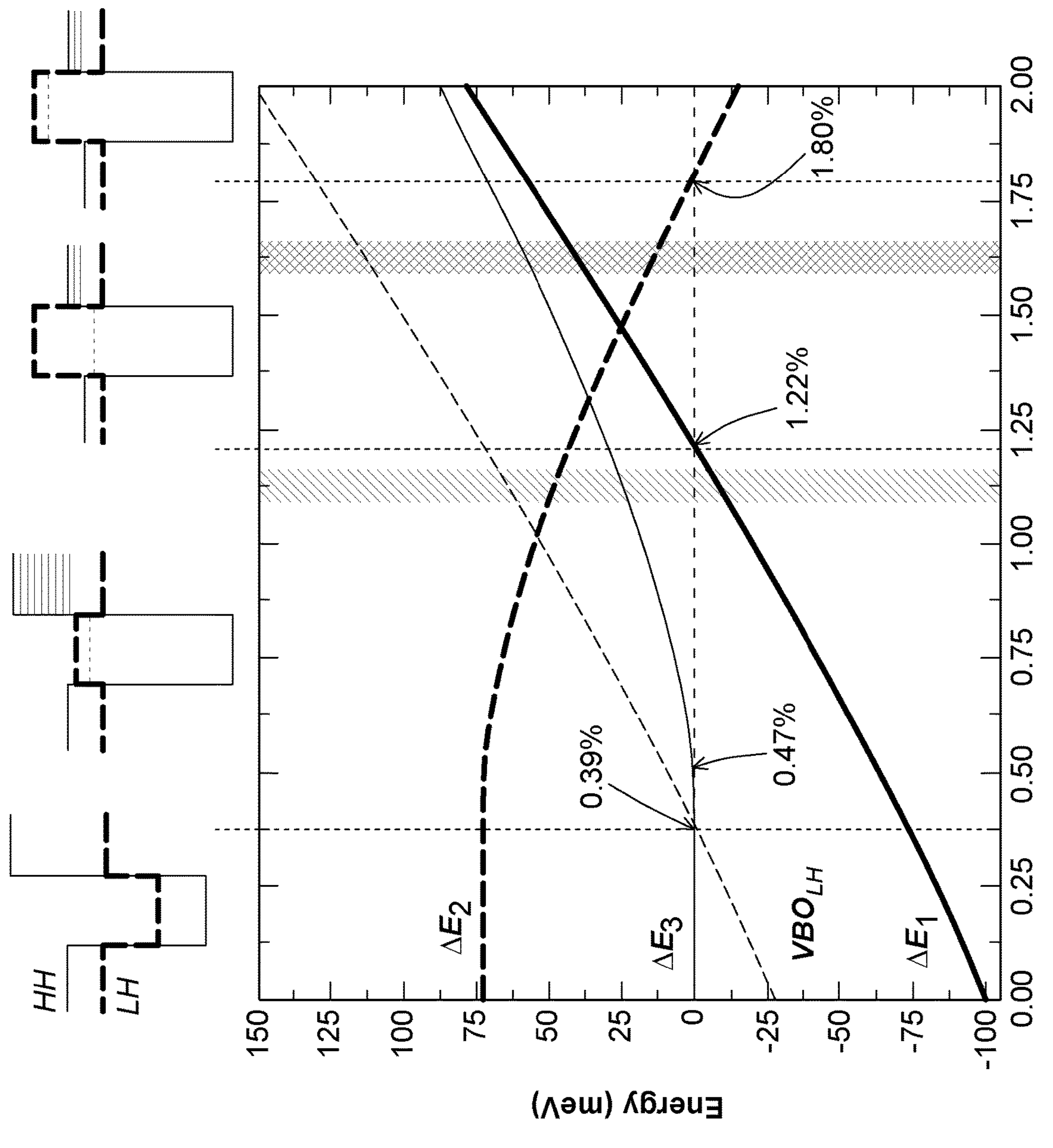
Figure 8C:
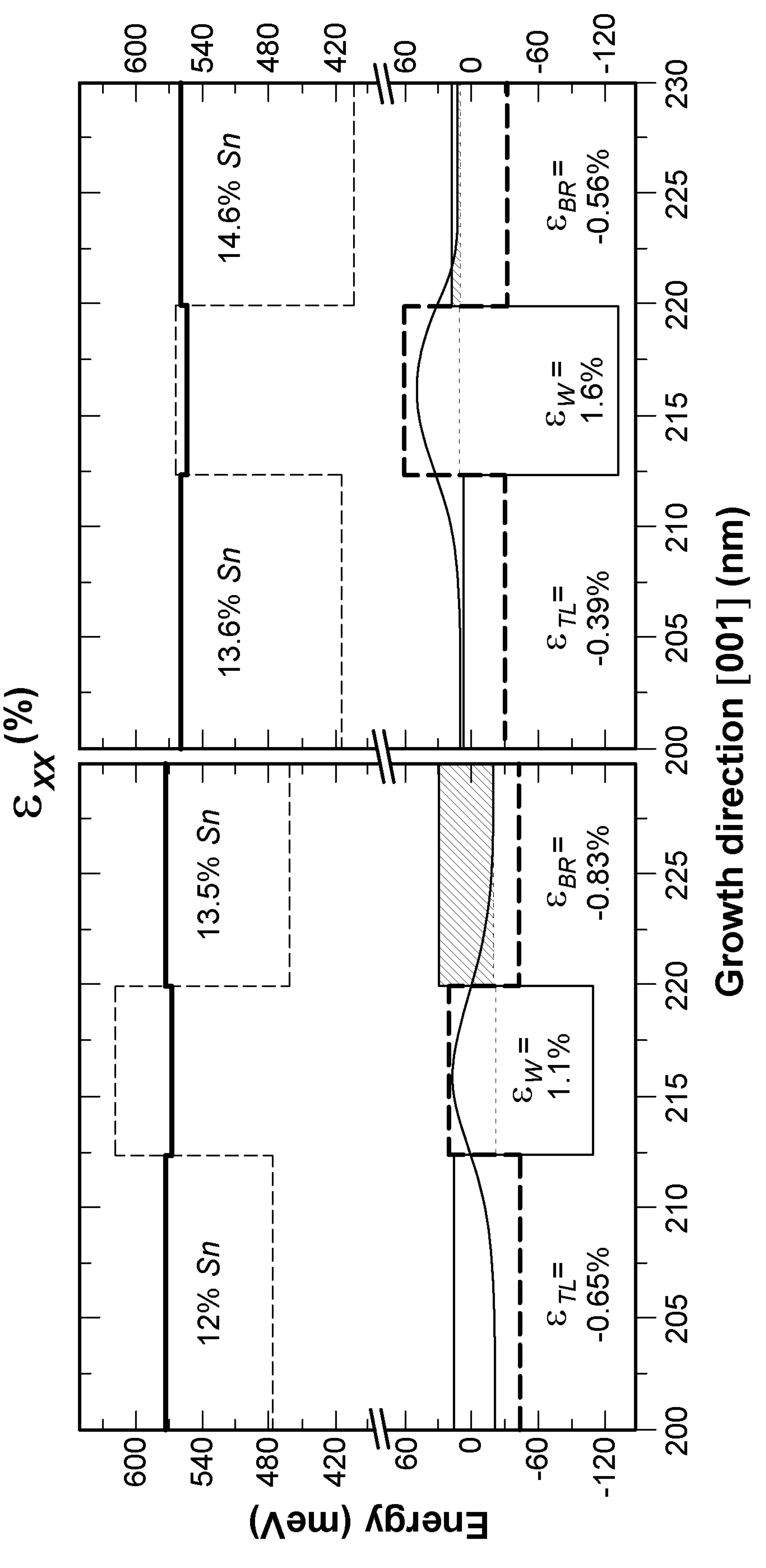

Now turning to FIG. 8, the band structure, and more particularly the band offset in the quantum heterostructure 20 will now be described. It is to be noted that these results have been achieved with a Ge/GeSn quantum heterostructure. The data presented show that the properties of tensile strained Ge QW exhibit four (4) different regimes defined by the level of strain. In order to have a heterostructure that is compatible with technological applications (i.e., clear quantum confinement and an operating temperature around room temperature), two conditions must be satisfied: (1) the splitting of light holes and heavy holes and (2) a valence band offset (VBO) of about 50 meV or higher. These two conditions are satisfied for two regimes corresponding to a tensile strain higher than 1%. This is the case of the quantum heterostructures developed using our method leading to a tensile strain exceeding 1.6% in some embodiments. This makes the quantum heterostructures an ideal low-dimensional system to control and manipulate light hole transport. Another aspect to consider is related to the fact that the obtained QWs are embedded in direct bandgap semiconductor barrier layers. This property adds the capability to efficiently manipulate independently or simultaneously high mobility charge carriers (light holes) and photons, thereby creating valuable opportunities to implement hybrid photonic-electronic devices and several quantum device architectures.

It will be appreciated that the quantum heterostructure 20 presented in the current description is compatible with silicon processing and technologies. The method for preparing the quantum heterostructure 20 enables a substantially precise control of the lattice parameter of each layer, thus leading to the growth of quantum well comprising a highly tensile-strained layer (e.g., strained Ge quantum well). The resulting quantum heterostructures 20 enable the filtering of light holes and the two-dimensional confinement of the same, thus creating a two-dimensional light hole gas. The quantum heterostructure 20 is compatible with Si-based and Ge-based technologies. While it may have been possible to obtain comparable or similar results using compound semiconductors, it is to be noted that compound semiconductors are not compatible with silicon processing, contrary to the quantum heterostructure 20 herein disclosed. The compound semiconductors are known to be costly, which also limits their deployment and implementation in large scale applications. Moreover, the presence of nuclear spin background in compound semiconductors hinders their use in spin-based technologies, contrary to the quantum heterostructure 20 disclosed herein.

One skilled in the art will also note that the obtained quantum heterostructure 20 is embedded in direct bandgap semiconductors. Direct bandgap semiconductors can emit and detect light in a substantially efficient way, and so this property adds to the capability to efficiently manipulate independently or simultaneously high mobility charge carriers (e.g., light holes) and photons, thereby creating valuable opportunities to implement hybrid photonic-electronic devices and several other quantum device architectures.

The quantum heterostructures presented in the current description exhibit many properties that may be advantageous when integrated into a device. For example, and without being limitative, the quantum heterostructures described herein allow to achieve good quantum confinement, LH confinement (with spin ½ and HH and electrons), high hole mobility, direct band gap semiconductor, two-dimensional light hole gas (2DLHG), controlled light hole-heaving hole interactions, strong spin-orbit coupling, pure linear Rashba spin-orbit interaction, absence of Dresselhaus spin-orbit interaction, controlled hyperfine interaction, compatibility with silicon processing and integration of silicon wafers, and scalability and manufacturability using current semiconductor processing infrastructures.

As it will be recognized by one skilled in the art these properties are notably relevant to the following applications, which serve an illustrative purpose only and should not be considered as being limitative: high-mobility electronics, high hole mobility transistors, spintronics, quantum information, quantum communication, quantum repeaters, optoelectrical and magnetic sensing, sensing and imaging, hybrid quantum photonics and electronics, light hole spin devices, quantum optoelectronics and many others.

Several alternative embodiments and examples have been described and illustrated herein. The embodiments described above are intended to be exemplary only. A person skilled in the art would appreciate the features of the individual embodiments, and the possible combinations and variations of the components. A person skilled in the art would further appreciate that any of the embodiments could be provided in any combination with the other embodiments disclosed herein. The present examples and embodiments, therefore, are to be considered in all respects as illustrative and not restrictive. Accordingly, while specific embodiments have been illustrated and described, numerous modifications come to mind without significantly departing from the scope defined in the appended claims.

REFERENCES

1. P. Y. Yu and M. Cardona, *Fundamental of Semiconductors*, Third (2005).
2. A. Dobbie, M. Myronov, R. J. H. Morris, A. H. A. Hassan, M. J. Prest, V. A. Shah, E. H. C. Parker, T. E. Whall, and D. R. Leadley, Appl. Phys. Lett. 101, 172108 (2012).
3. C. Morrison and M. Myronov, Appl. Phys. Lett. 111, 192103 (2017).
4. A. Sammak, D. Sabbagh, N. W. Hendrickx, M. Lodari, B. Paquelet Wuetz, A. Tosato, L. Yeoh, M. Bollani, M. Virgilio, M. A. Schubert, P. Zaumseil, G. Capellini, M. Veldhorst, and G. Scappucci, Adv. Funct. Mater. 1807613, 1807613 (2019).
5. A. Hikavyy, I. Zyulkov, H. Mertens, L. Witters, R. Loo, and N. Horiguchi, Mater. Sci. Semicond. Process. 70, 24 (2017).
6. L. Witters, H. Arimura, F. Sebaai, A. Hikavyy, A. P. Milenin, R. Loo, A. De Keersgieter, G. Eneman, T. Schram, K. Wostyn, K. Devriendt, A. Schulze, R. Lieten, S. Bilodeau, E. Cooper, P. Storck, E. Chiu, C. Vrancken, P. Favia, E. Vancoille, J. Mitard, R. Langer, A. Opdebeeck, F. Holsteyns, N. Waldron, K. Barla, V. De Heyn, D. Mocuta, and N. Collaert, IEEE Trans. Electron Devices 64, 4587 (2017).
7. O. Moutanabbir*, S. Miyamoto, E. E. Haller, and K. M. Itoh, Physical Review Letters Vol. 105, 026101 (2010).
8. K. Guilloy, N. Pauc, A. Gassenq, Y.-M. Niquet, J.-M. Escalante, I. Duchemin, S. Tardif, G. Osvaldo Dias, D. Rouchon, J. Widiez, J.-M. Hartmann, R. Geiger, T. Zabel, H. Sigg, J. Faist, A. Chelnokov, V. Reboud, and V. Calvo, ACS Photonics 3, 1907 (2016).
9. S. J. Sweeney, T. D. Eales, and A. R. Adams, J. Appl. Phys. 125, 082538 (2019).
10. R. A. Soref and L. Friedman, Superlattices Microstruct. 14, 189 (1993).
11. S. Wirths, R. Geiger, N. V. Den Driesch, G. Mussler, T. Stoica, S. Mantl, Z. Ikonic, M. Luysberg, S. Chiussi, J. M. Hartmann, H. Sigg, J. Faist, D. Buca, and D. Grützmacher, Nat. Photonics 9, 88 (2015).
12. J. Aubin, J. M. Hartmann, A. Gassenq, J. L. Rouviere, E. Robin, V. Delaye, D. Cooper, N. Mollard, V. Reboud, and V. Calvo, Semicond. Sci. Technol. 32, 094006 (2017).
13. J. Margetis, S.-Q. Yu, N. Bhargava, B. Li, W. Du, and J. Tolle, Semicond. Sci. Technol. 32, 124006 (2017).
14. S. Assali, J. Nicolas, S. Mukherjee, A. Dijkstra, and O. Moutanabbir, Appl. Phys. Lett. 112, 251903 (2018).

15. S. Assali, J. Nicolas, and O. Moutanabbir, J. Appl. Phys. 125, 025304 (2019).
16. S. Takeuchi, A. Sakai, O. Nakatsuka, M. Ogawa, and S. Zaima, Thin Solid Films 517, 159 (2008).
17. S. Wirths, A. T. Tiedemann, Z. Ikonic, P. Harrison, B. Hollander, T. Stoica, G. Mussler, M. Myronov, J. M. Hartmann, D. Grutzmacher, D. Buca, and S. Mantl, Appl. Phys. Lett. 102, 192103 (2013).
18. V. A. Volodin, V. A. Timofeev, A. R. Tuktamyshev, and A. I. Nikiforov, JETP Lett. 105, 327 (2017).
19. Y. Bai, K. E. Lee, C. Cheng, M. L. Lee, and E. A. Fitzgerald, J. Appl. Phys. 104, 084518 (2008).
20. M. Clavel, P. Goley, N. Jain, Yan Zhu, and M. K. Hudait, IEEE J. Electron Devices Soc. 3, 184 (2015).
21. M. Clavel, D. Saladukha, P. S. Goley, T. J. Ochalski, F. Murphy-Armando, R. J. Bodnar, and M. K. Hudait, ACS Appl. Mater. Interfaces 7, 26470 (2015).
22. D. Saladukha, M. B. Clavel, F. Murphy-Armando, G. Greene-Diniz, M. Grüning, M. K. Hudait, and T. J. Ochalski, Phys. Rev. B 97, 195304 (2018).
23. D. Stange, N. von den Driesch, D. Rainko, C. Schulte-Braucks, S. Wirths, G. Mussler, A. T. Tiedemann, T. Stoica, J. M. Hartmann, Z. Ikonic, S. Manti, D. Grützmacher, and D. Buca, Opt. Express 24, 1358 (2016).
24. S. Xu, W. Wang, Y.-C. Huang, Y. Dong, S. Masudy-Panah, H. Wang, X. Gong, and Y.-C. Yeo, Opt. Express 27, 5798 (2019).

The invention claimed is:

1. A quantum heterostructure, comprising:

a substrate comprising a strain-engineered material;

a stack of coextending GeSn buffer layers on the substrate, each GeSn buffer layer having a different Sn content one from another, wherein the Sn content of each GeSn buffer layer is comprised in a range extending from 4.9 at. % to 13.4 at. %; and a quantum well extending over the stack of coextending GeSn buffer layers, the quantum well comprising a highly tensile-strained layer, the highly tensile-strained layer being sandwiched between a bottom barrier layer and a top barrier layer and comprising at least one group IV element and having a strain greater than or equal to 1%, wherein the highly tensile-strained layer has a thickness equal or below 10 nm.

2. The quantum heterostructure of claim 1, wherein the at least one group IV element is germanium.

3. The quantum heterostructure of claim 1, wherein the stack of coextending GeSn buffer layers comprises between one and six layers.

4. The quantum heterostructure of claim 1, wherein the stack of coextending GeSn buffer layers and the quantum well comprise one of: at least one p-type doped layer, at least one n-type doped layer, at least one p-n junction and at least one p-i-n junction.

5. The quantum heterostructure of claim 1, wherein the strain ranges from about 1% to about 2%, preferably from about 1.55% to about 1.75%.

6. The quantum heterostructure of claim 1, wherein the strain is equal to or higher than 2%.

7. The quantum heterostructure of claim 1, wherein, the substrate is one of an Si-on-insulator (SOI) wafer, bulk GE, a Ge-on-insulator (GOI) wafer, a compound semiconductor wafer, a compound semiconductor layer grown on Si, a compound semiconductor layer grown on Ge, a compound semiconductor layer grown on SOI, and a compound semiconductor layer grown on GOI.

8. The quantum heterostructure of claim 1, wherein the composition of the buffer layers varies substantially continuously across the stack of coextending GeSn buffer layers.

9. A method for preparing a quantum heterostructure, comprising:

conditioning a reactor chamber to reach initial growth conditions;

supplying a Ge-based precursor and a Sn-based precursor in the reactor chamber;

forming a stack of coextending GeSn buffer layers on a substrate comprising a strain-engineered material and provided inside the reactor chamber, comprising:

forming a first GeSn buffer layer by exposing the substrate to the initial growth conditions;

conditioning the reactor chamber to reach subsequent growth conditions, comprising:

changing a reactor temperature; and varying a molar fraction of at least one of the Sn-based precursor and the Ge-based precursor;

forming one or more subsequent GeSn buffer layers on the first buffer layer by exposing the first GeSn buffer layer to the subsequent growth conditions, each GeSn buffer layer having a different Sn content from one another, wherein the Sn content of each GeSn buffer layer is comprised in a range extending from 4.9 at. % to 13.4 at. %; and forming a quantum well over the stack of coextending GeSn buffer layers, the quantum well comprising a highly tensile-strained layer, the highly tensile-strained layer comprising at least one group IV element and having a strain greater than or equal to 1%, wherein the highly tensile-strained layer has a thickness equal or below 10 nm.

10. The method of claim 9, wherein said growing of the stack of coextending GeSn buffer layers and said growing of the highly tensile-strained quantum well are each carried out with an epitaxial growth method, wherein said epitaxial growth method comprises a low-pressure chemical vapor deposition.

11. The method of claim 9, further comprising preparing the substrate, said preparing comprising growing a virtual substrate layer on an original substrate layer, wherein said step of growing the virtual substrate layer is carried out at a temperature ranging from about 460° C. to about 600° C. and further comprises thermally treating the virtual substrate layer at a thermal treatment temperature greater than or equal to 800° C.

12. The method of claim 9, wherein each buffer layer is grown at a substantially constant reactor pressure, a substantially constant $H_2$ flow and a substantially constant molar fraction of the Ge-based precursor.

13. The method of claim 9, wherein the Ge-based precursor is $G_eH_4$ and the Sn-based precursor is $SnCl_4$.

14. The method of claim 9, wherein said changing the reactor temperature comprises reducing the temperature and said varying the molar fraction of said at least one of the Sn-based precursor and the Ge-based precursor comprises reducing the molar fraction of the Sn-based precursor.

15. The method of claim 9, wherein said forming of the stack of coextending GeSn buffer layers includes supplying at least two of silicon, germanium, tin and carbon precursors.

16. A quantum heterostructure, comprising:

a plurality of buffer layers on a substrate comprising a strain-engineered material, each buffer layer being made from an alloy and having a different composition one from another, the alloy comprising at least two group-IV elements wherein the Sn content of each buffer layer is comprised in a range extending from 4.9 at. % to 13.4 at. %;

a bottom barrier layer extending over the plurality of buffer layers;

a tensile-strained semiconductor layer extending over the bottom barrier layer, the tensile-strained semiconductor layer being made from one group-IV element and having a strain greater than or equal to 1%, wherein the highly tensile-strained layer has a thickness equal or below 10 nm; and a top barrier layer extending over the tensile-strained semiconductor layer.

17. The quantum heterostructure of claim 16, wherein the alloy comprises at least two of: silicon, germanium, tin, and carbon.

18. The quantum heterostructure of claim 16, wherein the tensile-strained semiconductor layer is made from germanium, silicon, carbon, tin or a combination thereof.

19. The quantum heterostructure of claim 16, wherein the composition of the buffer layers varies substantially continuously across the stack.

* * * * *